(12) United States Patent
Kitazawa et al.

(10) Patent No.: US 8,269,099 B2
(45) Date of Patent: Sep. 18, 2012

(54) ELECTRON DONATING ORGANIC MATERIAL FOR PHOTOVOLTAIC DEVICES, MATERIAL FOR PHOTOVOLTAIC DEVICES, AND PHOTOVOLTAIC DEVICE

(75) Inventors: Daisuke Kitazawa, Shiga (JP); Jun Tsukamoto, Shiga (JP); Yukari Jo, Shiga (JP)

(73) Assignee: Toray Industries, Inc. (JP)

( * ) Notice: Subject to any disclaimer, the term of this patent is extended or adjusted under 35 U.S.C. 154(b) by 626 days.

(21) Appl. No.: 12/441,150

(22) PCT Filed: Oct. 4, 2007

(86) PCT No.: PCT/JP2007/069436
§ 371 (c)(1),
(2), (4) Date: Mar. 13, 2009

(87) PCT Pub. No.: WO2008/044585
PCT Pub. Date: Apr. 17, 2008

(65) Prior Publication Data
US 2010/0006154 A1 Jan. 14, 2010

(30) Foreign Application Priority Data

Oct. 11, 2006 (JP) .................................. 2006-277315
Jan. 29, 2007 (JP) .................................. 2007-017499

(51) Int. Cl.
*H01L 31/04* (2006.01)
*H01B 1/12* (2006.01)
*H01L 31/00* (2006.01)
*H01B 1/00* (2006.01)

(52) U.S. Cl. ........ 136/263; 528/373; 528/380; 528/423; 252/500

(58) Field of Classification Search ................... 528/380, 528/373, 423; 136/263; 252/500
See application file for complete search history.

(56) References Cited

U.S. PATENT DOCUMENTS
2004/0002576 A1 1/2004 Oguma et al.

(Continued)

FOREIGN PATENT DOCUMENTS
EP 1 344 788 A1 9/2003
(Continued)

OTHER PUBLICATIONS

He et al; Organic solar—and PCBM; May 2006; Elsevier B.V., Chem Abstract 146: 29860.*

(Continued)

*Primary Examiner* — Duc Truong
(74) *Attorney, Agent, or Firm* — DLA Piper LLP (US)

(57) ABSTRACT

A photovoltaic device with high photoelectric conversion efficiency includes an electron donating organic material for photovoltaic devices containing a conjugated polymer represented by formula (1):

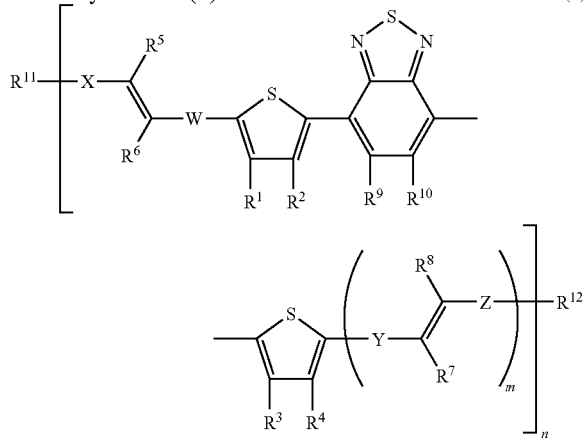

wherein $R^1$ to $R^{10}$ may be the same or different from each other and are each selected from the group consisting of hydrogen, an alkyl group, an alkoxy group and an aryl group; $R^{11}$ and $R^{12}$ may be the same or different from each other and are each selected from the group consisting of hydrogen, an alkyl group, an aryl group, a heteroaryl group and halogen; W, X, Y and Z may be the same or different from each other and are each selected from the group consisting of a single bond, an arylene group, a heteroarylene group, an ethenylene group, and an ethynylene group; m is 0 or 1; n is within a range of 1 to 1000.

10 Claims, 1 Drawing Sheet

U.S. PATENT DOCUMENTS

| | | |
|---|---|---|
| 2004/0115473 A1 | 6/2004 | Burroughes et al. |
| 2006/0052612 A1 | 3/2006 | Stossel et al. |
| 2006/0174937 A1 | 8/2006 | Zhou |

FOREIGN PATENT DOCUMENTS

| | | |
|---|---|---|
| EP | 1 571 170 A1 | 9/2005 |
| EP | 1 691 428 A2 | 8/2006 |
| JP | 2003-104976 A | 4/2003 |
| JP | 2003-347565 A | 12/2003 |
| JP | 2004-002703 A | 1/2004 |
| JP | 2004-165474 A | 6/2004 |
| JP | 2004-168999 A | 6/2004 |
| JP | 2006-222429 A | 8/2006 |
| WO | 2004/039859 A1 | 5/2004 |

OTHER PUBLICATIONS

Zhang et al; Highly—liquid crystal guest host system; Feb. 2006; Royal Society of Chemistry; Chem Abstract 144:371564.*

J.J.M. Halls et al., "Efficient photodiodes from interpenetrating polymer networks," Nature, vol. 376, Aug. 10, 1995, pp. 498-500.

G. Yu et al., "Polymer Photovoltaic Cells: Enhanced Efficiencies via a Network of Internal Donor-Acceptor Heterojunctions," Science, vol. 270, Dec. 15, 1995, pp. 1789-1791.

E. Kymakis et al., "Single-wall carbon nanotube/conjugated polymer photovoltaic devices," Applied Physics Letters, vol. 80, No. 1, Jan. 7, 2002, pp. 112-114.

Xianzhcn Li et al., Synthesis and properties of novel poly(p-phenylenevinylene) copolymers for near-infrared emitting diodes, European Polymer Journal, vol. 41, 2005, pp. 2923-2933.

Xuelong Zhang et al,, "Highly dichroic benzo-2,1,3-thiadiazole dyes containing five linearly $\pi$-conjugated aromatic residues, with fluorescent emission ranging from greed to red, in a liquid crystal guest-host system," Journal of Materials Chemistry, vol. 16(8), Feb. 28, 2006, pp. 736-740.

Chang He et al., "Organic solar cells based on the spin-coated blend films of TPA-th-TPA and PCBM," Solar Energy Materials & Solar Cells, vol. 90(12), Jul. 24, 2006, pp. 1815-1827.

* cited by examiner

ELECTRON DONATING ORGANIC MATERIAL FOR PHOTOVOLTAIC DEVICES, MATERIAL FOR PHOTOVOLTAIC DEVICES, AND PHOTOVOLTAIC DEVICE

RELATED APPLICATIONS

This is a §371 of International Application No. PCT/JP2007/069436, with an international filing date of Oct. 4, 2007 (WO 2008/044585 A1, published Apr. 17, 2008), which is based on Japanese Patent Application Nos. 2006-277315, filed Oct. 11, 2006, and 2007-017499, filed Jan. 29, 2007.

TECHNICAL FIELD

This disclosure relates to an electron donating organic material for photovoltaic devices, a material for photovoltaic devices using the same and a photovoltaic device.

BACKGROUND

Solar cells have been attracting attention as an environment-friendly electric energy source and as an energy source which is effective against the energy problem with increasing seriousness currently. Now, inorganic substances, such as monocrystalline silicon, polycrystal-line silicon, amorphous silicon and compound semiconductor, are used as a semiconductor material of a photovoltaic device of a solar cell. However, solar cells produced using inorganic semiconductors have not spread widely for home use because of their cost higher than that of power generation systems such as thermal power generation and nuclear power generation. Such a high cost is derived mainly from the process of producing a semiconductor film in vacuum at high temperatures. In such situations, organic solar cells using organic semiconductors such as conjugated polymers and organic crystals or organic dyes have been investigated as semiconductor materials with which the production process is expected to be simplified.

However, the most serious problem with organic solar cells using conjugated polymers and so on is that such solar cells are low in photoelectric conversion efficiency in comparison with solar cells using conventional inorganic semiconductors, and therefore such solar cells have not been used practically, yet. The following two points are major reasons for the low photoelectric conversion efficiency of organic solar cells using conventional conjugated polymers. The first reason is that a bound state called exciton in which an electron and a hole generated by incident light are resistant to separation is formed. The second reason is that since a trap which captures a carrier (electron or hole) is likely to be formed, a formed carrier tends to be captured by the trap, resulting in low mobility of carriers. In other words, while a semiconductor material is generally required that the carriers of the material has a high mobility $\mu$, there is a problem that conjugated polymers have mobilities $\mu$ being lower than those of conventional inorganic crystalline semiconductors or amorphous silicon.

Therefore, finding the means for successfully separating a formed electron and a formed hole from exciton and the means for preventing carriers from scattering between amorphous regions of a conjugated polymer or between conjugated polymer chains or from being captured by the trap to increase the mobility is the key for bringing solar cells using organic semiconductors in practical use.

The hitherto known photoelectric conversion devices can now be generally classified into the following elemental constitutions; that is, a Schottky type in which an electron donating organic material (p-type organic semiconductor) and metal with a small work function are joined, and a heterojunction type in which an electron accepting organic material (n-type organic semiconductor) and an electron donating organic material (p-type organic semiconductor) are joined, and so on. In such devices, since only organic layers (almost several molecular layers) in a junction contribute to the generation of a photocurrent, the photoelectric conversion efficiency is low and, therefore, the improvement in the efficiency is a pending problem.

One approach for increasing the photoelectric conversion efficiency is a bulk hetero-junction type in which an electron accepting organic material (n-type organic semiconductor) and an electron donating organic material (p-type organic semiconductor) are mixed so that joined surfaces which contribute to photoelectric conversion are increased (see, for example, J. J. M. Halls, C. A. Walsh, N. C. Greenham, E. A. Marseglla, R. H. Frirnd, S. C. Moratti, A. B. Homes, "Nature," No. 376, p. 498, 1995). In particular, photoelectric conversion materials using a conjugated polymer as an electron donating organic material (p-type organic semiconductor) and using fullerene such as $C_{60}$ or carbon nanotubes as well as a conducting polymer having an n-type semiconductor property as an electron accepting organic material have been reported (see, for example, E. Kymakis, G. A. J. Amaratunga, "Applied Physics Letters" (USA), Vol. 80, p. 112, 2002, G. Yu, J. Gao, J. C. Hummelen, F. Wudl, A. J. Heeger, "Science," Vol. 270, p. 1789, 1995 and Japanese Unexamined Patent Application Nos. 2003-347565 (Claims 1 and 3) and 2004-165474 (Claims 1 and 3)).

Moreover, a photoelectric conversion material has been reported which comprises a conjugated polymer with a band gap having been reduced by the introduction of an electron donating group and an electron attracting group into a main chain to cause the polymer to efficiently absorb the radiant energy of a wide range of the sunlight spectrum (see, for example, US Unexamined Patent Application Publication No. 2006/174937 specification). Strenuous researches are made to thiophene skeletons as the electron donating group and to benzothiadiazole skeletons as the electronic attracting group (see, for example, X. Li, W. Zeng, Y. Zhang, Q. Hou, W. Yang, Y. Cao, "European Polymer Journal," Vol. 41, p. 2923, 2005, Japanese Unexamined Patent Application Publication No. 2003-104976 (Claims 1 and 9) and US Unexamined Patent Application Publication Nos. 2004/115473 specification and 2006/52612 specification). However, sufficient photoelectric conversion efficiency has not been obtained, yet.

As described above, such conventional organic solar cells are problematic low in photoelectric conversion efficiency. It could therefore be helpful to provide a photovoltaic device with high photoelectric conversion efficiency.

SUMMARY

We provide an electron donating organic material for photovoltaic devices containing a conjugated polymer represented by formula (1), a material for photovoltaic devices using the same, and a photovoltaic device.

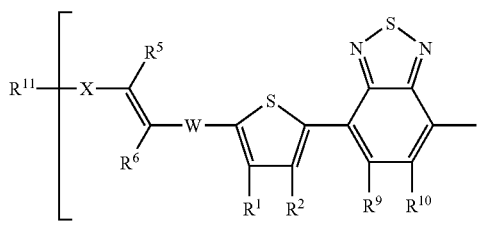

(1)

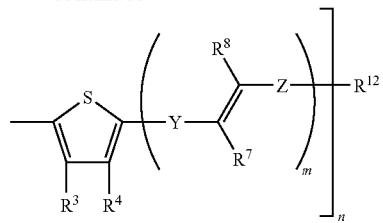

$R^1$ to $R^{10}$ may be the same or different from each other and are each selected from the group consisting of hydrogen, an alkyl group, an alkoxy group and an aryl group. $R^{11}$ and $R^{12}$ may be the same or different from each other and are each selected from the group consisting of hydrogen, an alkyl group, an aryl group, a heteroaryl group and halogen. W, X, Y and Z may be the same or different from each other and are each selected from the group consisting of a single bond, an arylene group, a heteroarylene group, an ethenylene group, and an ethynylene group. m is 0 or 1. n is within a range of 1 to 1000.

We also provide an electron donating organic material for photovoltaic devices which comprises a conjugated polymer represented by formula (1):

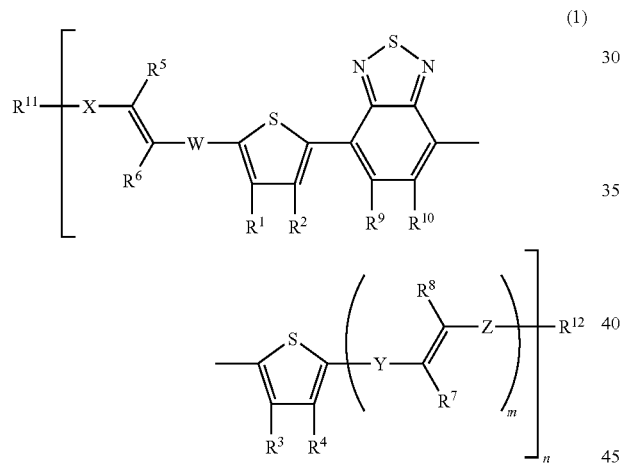

wherein $R^1$ to $R^{10}$ may be the same or different from each other and are each selected from the group consisting of hydrogen, an alkyl group, an alkoxy group and an aryl group; $R^{11}$ and $R^{12}$ may be the same or different from each other and are each selected from the group consisting of hydrogen, an alkyl group, an aryl group, a heteroaryl group and halogen; and Y may be the same or different from each other and are each selected from the group consisting of a single bond, an arylene group, a heteroarylene group, an ethenylene group, and an ethynylene group; X and Z may be the same or different from each other, wherein each may be selected from the group consisting of an arylene group, a heteroarylene group, and an ethenylene group and at least one of them is a heteroarylene group when n=1, wherein each may be selected from the group consisting of a single bond, an arylene group, a heteroarylene group, an ethenylene group, and an ethynylene group when n>1; m is 0 or 1; n is within a range of 1 to 1000.

It thus becomes possible to provide a photovoltaic device with high photoelectric conversion efficiency.

EXPLANATION OF REFERENTIAL SYMBOLS

Figure 1:
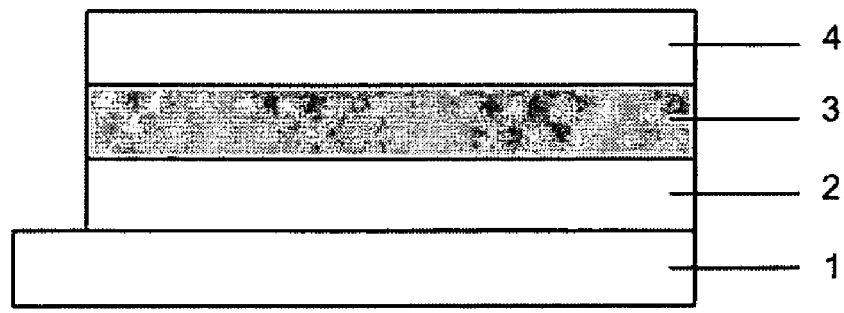
FIG. 1 is a schematic diagram which illustrates one aspect of our photovoltaic devices.

1 Substrate
2 Positive electrode
3 Organic Semiconductor Layer
4 Negative electrode
5 Layer having a conjugated polymer represented by formula (1)
6 Layer having an acceptor material

DETAILED DESCRIPTION

The electron donating organic material for photovoltaic devices, which may hereinafter be referred to as "donor material," contains a conjugated polymer represented by formula (1). The material for photovoltaic devices means a material used for various devices using a photoelectrically converting function, an optically rectifying function, and the like, such as photoelectric cells (such as solar cells), electronic devices (such as photosensors, optical switches, and phototransistors) and optically recording materials (such as optical memories).

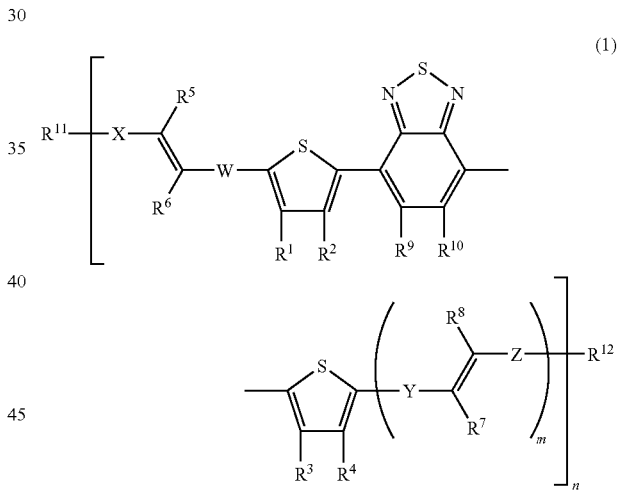

$R^1$ to $R^{10}$ may be the same or different from each other and are each selected from the group consisting of hydrogen, an alkyl group, an alkoxy group and an aryl group. $R^{11}$ and $R^{12}$ may be the same or different from each other and are each selected from the group consisting of hydrogen, an alkyl group, an aryl group, a heteroaryl group and halogen. W, X, Y and Z may be the same or different from each other and are each selected from the group consisting of a single bond, an arylene group, a heteroarylene group, an ethenylene group, and an ethynylene group. m is 0 or 1. n is within a range of 1 to 1000.

The alkyl group represents a saturated aliphatic hydrocarbon group, such as a methyl group, an ethyl group, a propyl group, a butyl group, a pentyl group, a hexyl group, a heptyl group, an octyl group, a nonyl group, a decyl group, an undecyl group and a dodecyl group. The alkyl group may be linear or branched and also may be unsubstituted or substituted. The number of carbon atoms of the alkyl group preferably is 2 to 20. Examples of the substituent in the case of being substituted include an alkoxy group described below, an alkylthio group, a cyano group and halogen. The alkoxy group represents an aliphatic hydrocarbon group with an ether linkage, such as a methoxy group, an ethoxy group, a propoxy group and a butoxy group. The alkoxy group may be unsubstituted or substituted. The number of carbon atoms of the alkoxy group preferably is 2 to 20. The aryl group represents an aromatic hydrocarbon group, such as a phenyl group, a naphthyl group, a biphenyl group, phenanthryl group, an anthryl group, a terphenyl group, a pyrenyl group and a fluorenyl group. The aryl group may be unsubstituted or substituted. The number of carbon atoms of the aryl group preferably is 6 to 20. The heteroaryl group represents a heteroaromatic ring group having an atom or atoms other than carbon, such as a thienyl group, a furyl group, a pyrrolyl group, an imidazolyl group, a pyrazolyl group, an oxazolyl group, a pyridyl group, a pyrazyl group, a pyrimidyl group, a quinolinyl group, an isoquinolyl group, a quinoxalyl group, an acridinyl group and a carbazolyl group. The heteroaryl group may be unsubstituted or substituted. The number of ring(s) constituting the heteroaryl group preferably is 1 to 6. Examples of the substituents when the alkoxy group, the aryl group and the heteroaryl group are substituted include an alkyl group, an alkoxy group, an alkylthio group, a cyano group and halogen. The halogen is any one of fluorine, chlorine, bromine and iodine.

The arylene group represents a divalent (i.e., having two binding sites) aromatic hydrocarbon group. The arylene group may be unsubstituted or substituted. The number of carbon atoms of the arylene group preferably is 6 to 20. Specific examples of the arylene group include divalent groups corresponding to those provided as specific examples of the aryl group. The heteroarylene group represents a divalent heteroaromatic ring group. The heteroarylene group may be unsubstituted or substituted. Specific examples of the heteroarylene group include divalent groups corresponding to those provided as specific examples of the heteroaryl group. The number of ring(s) constituting the heteroarylene group preferably is 1 to 6. The ethenylene group represents a trans-form —C=C— double bond or a cis-form —C=C— double bond. The ethenylene group may be unsubstituted or substituted. Examples of the substituents when the arylene group, the heteroarylene group and the ethenylene group are substituted include an alkyl group, an alkoxy group, an alkylthio group, a cyano group and halogen. The ethynylene group represents a —C≡C— triple bond.

$R^1$ to $R^{12}$ each preferably are hydrogen or an alkyl group.

W, X, Y and Z may be the same or different from each other and are each selected from the group consisting of a single bond, an arylene group, a heteroarylene group, an ethenylene group, and an ethynylene group, and may be in combination of two or more thereof. X and Z each preferably are a single bond, an ethynylene group which may have a substituent or an arylene group which may have a substituent. W and Y each preferably are a single bond or an ethynylene group which may have a substituent.

The ethenylene group of the conjugated polymer represented by formula (1) (i.e., the C=C double bond to which $R^5$, $R^6$, $R^7$ and $R^8$ are attached) has a steric hindrance less than that of aromatic cyclic groups such as thienyl group and fluorenyl group. It, therefore, is considered to have a function of increasing the planarity of the conjugated polymer to increase optical absorption or carrier mobility. Moreover, the triad of thiophene-benzothiadiazole-thiophene contained in the conjugated polymer represented by formula (1) has a property of shifting up the optical absorption wavelength range. The shift up of the optical absorption wavelength range is extremely advantageous in that the short-circuit current density of a photovoltaic device is increased. Therefore, it is considered that by inserting an ethenylene group to the outside of this triad, it is possible to increase optical absorption or carrier mobility while maintaining excellent characteristics due to the triad.

In formula (1), n represents a polymerization degree of a conjugated polymer and is within a range of 1 to 1000. Such a polymer that the n in formula (1) is 1 also shall be referred to as a conjugated polymer. In view of the easiness of film formation, the polymer preferably is soluble in a solvent, n preferably is 1 to 500, and more preferably is less than or equal to 100. The polymerization degree of a conjugated polymer can be determined from a weight average molecular weight. The weight average molecular weight can be determined by conducting measurement by the use of GPC (gel permeation chromatography) followed by conversion to standard samples of polystyrene. To make it soluble in a solvent, it is preferable that at least one of $R^1$ to $R^{12}$ be an alkyl group. When the molecular weight of the conjugated polymer is small, the conjugated polymer will have a lowered glass transition temperature or a lowered melting point if it has excessively many alkyl groups. Therefore, when n in formula (1) is not less than 1 but less than 10, it is more preferable that $R^1$ to $R^{12}$ contain 1 to 8 alkyl groups. When the molecular weight of a conjugated polymer is high, the solubility will decrease if there are an excessively small number of alkyl groups. Therefore, when n in formula (1) is 10 or more, it is more preferable that $R^1$ to $R^{12}$ contain four or more alkyl groups.

Examples of the conjugated polymer represented by formula (1) include a conjugated polymer represented by the following formula (2):

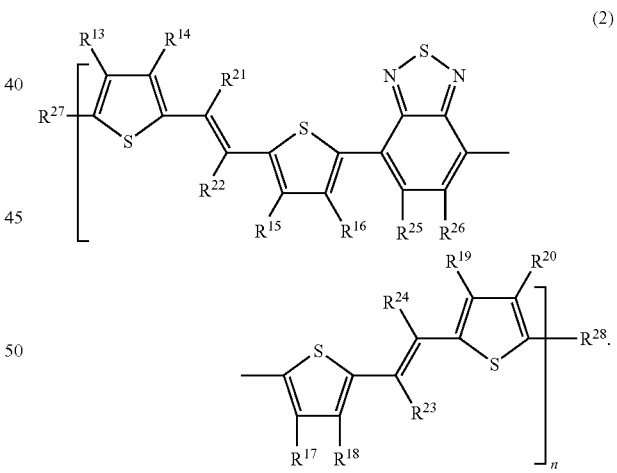

$R^{13}$ to $R^{26}$ may be the same or different from each other and are each selected from the group consisting of hydrogen, an alkyl group, an alkoxy group and an aryl group. $R^{27}$ and $R^{28}$ may be the same or different from each other and are each hydrogen or an alkyl group; n is within a range of 1 to 1000. The alkyl group, the alkoxy group, the aryl group and n are the same as those explained for formula (1). To make it soluble in a solvent, it is preferable that at least one of $R^{13}$ to $R^{28}$ be an alkyl group.

Examples of the conjugated polymer represented by formula (1) or formula (2) include the structures provided below:

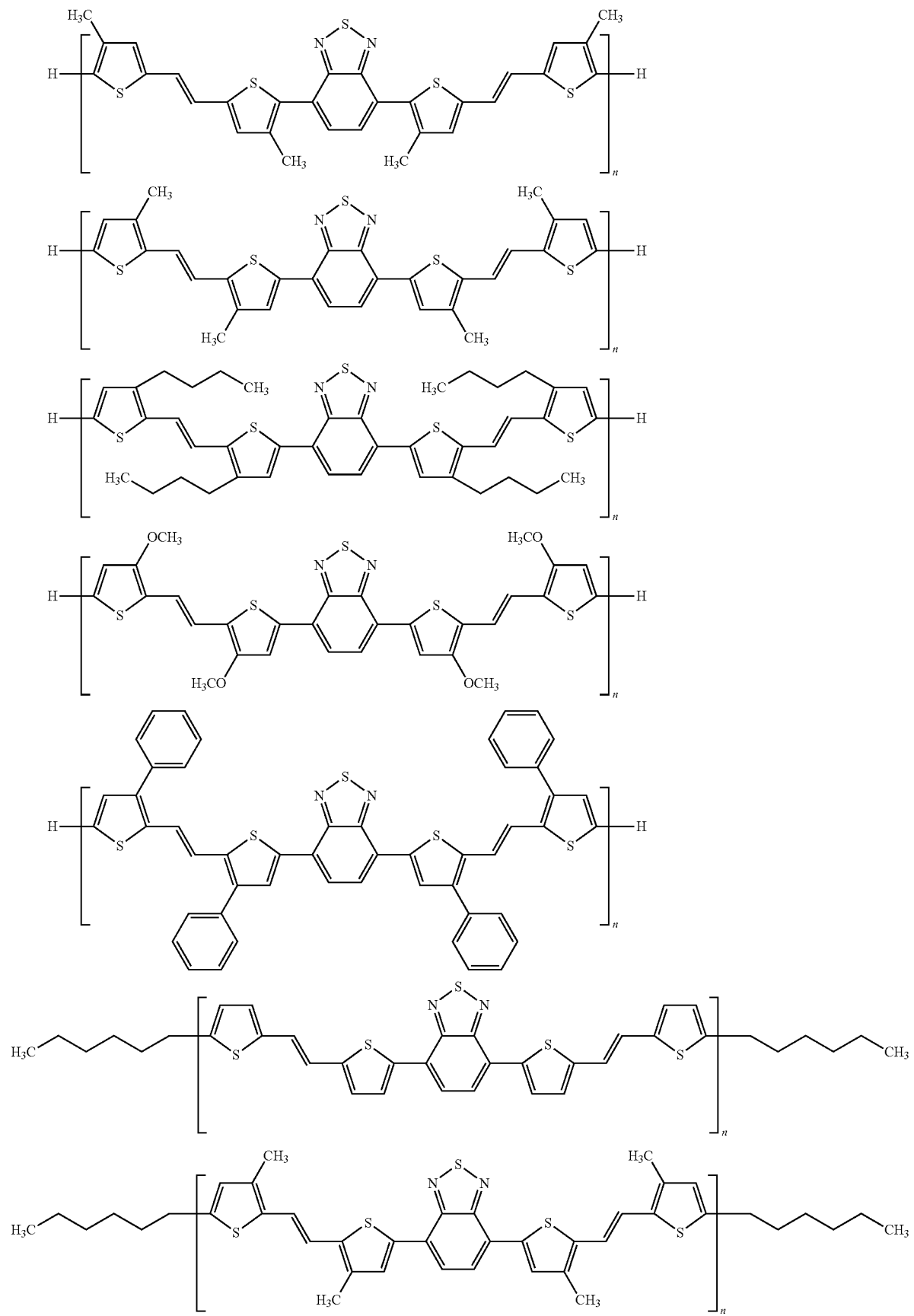

-continued
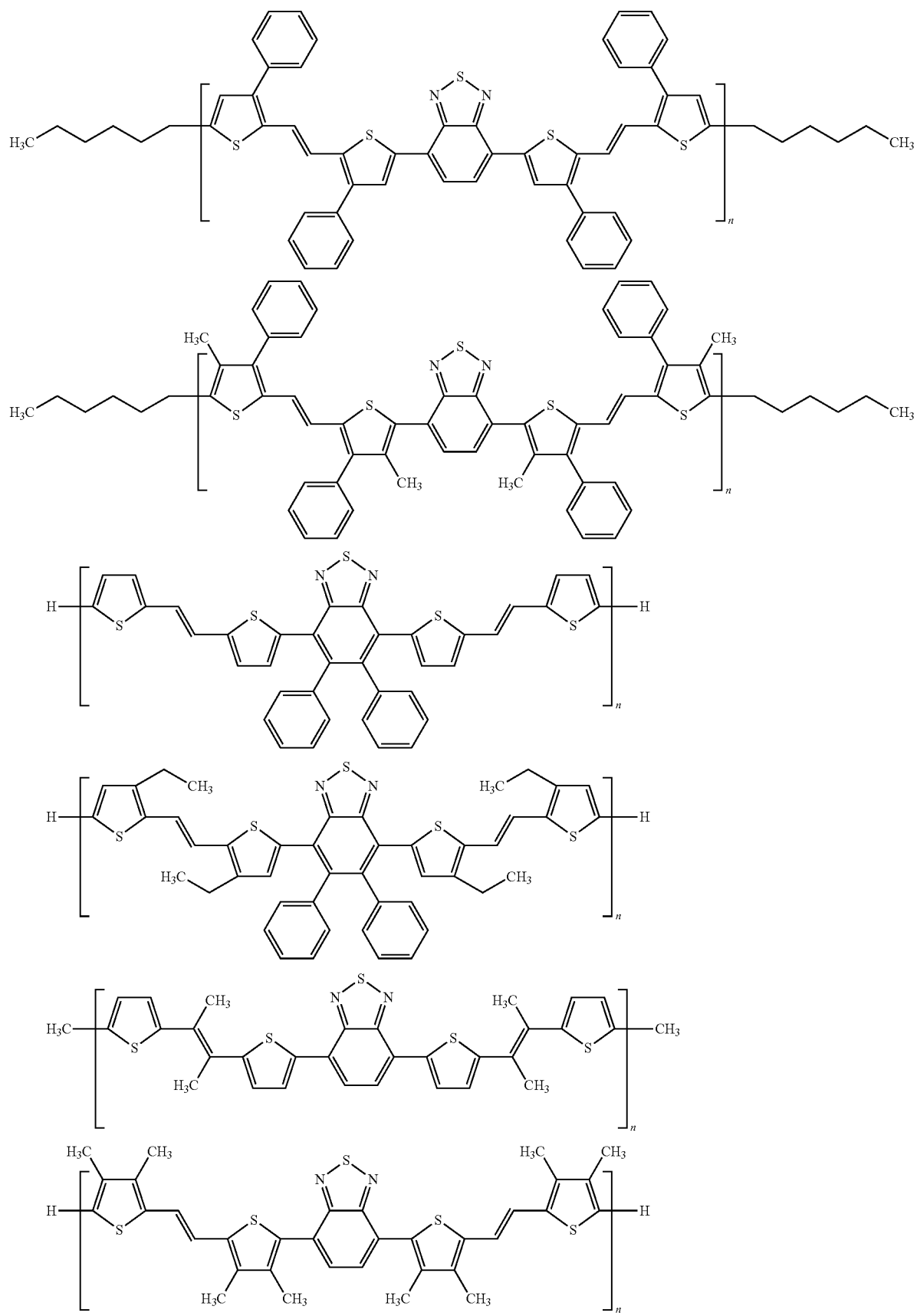

-continued
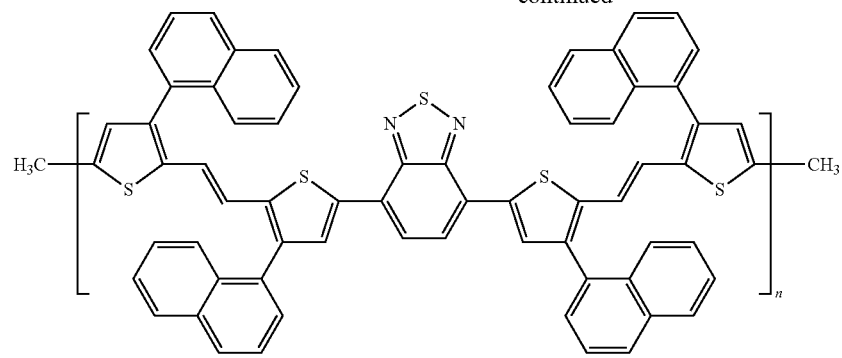
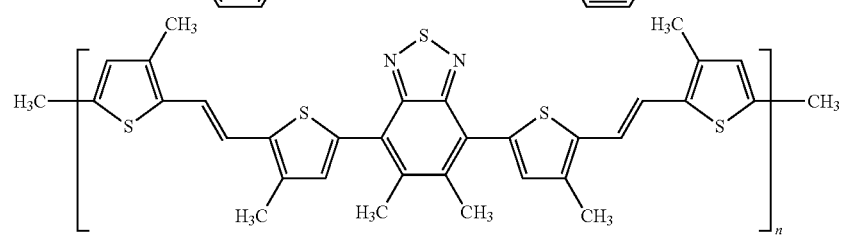
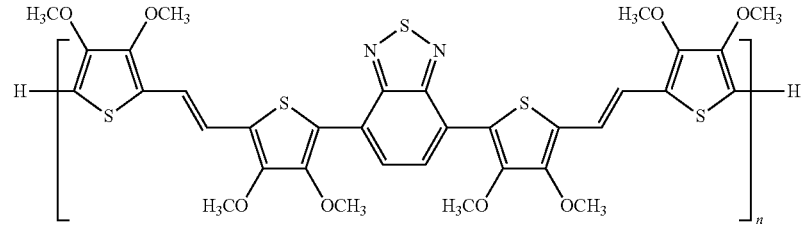
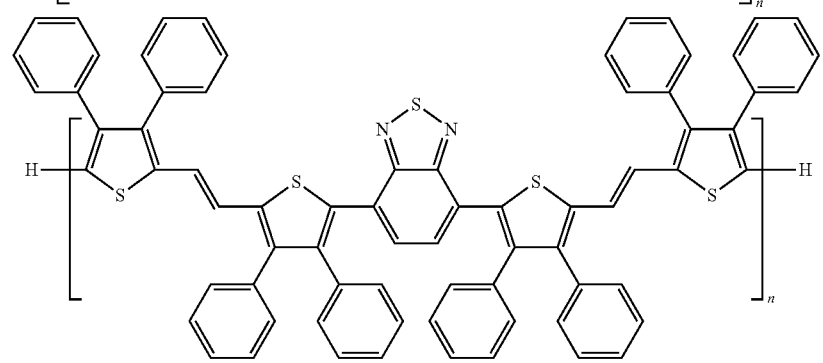
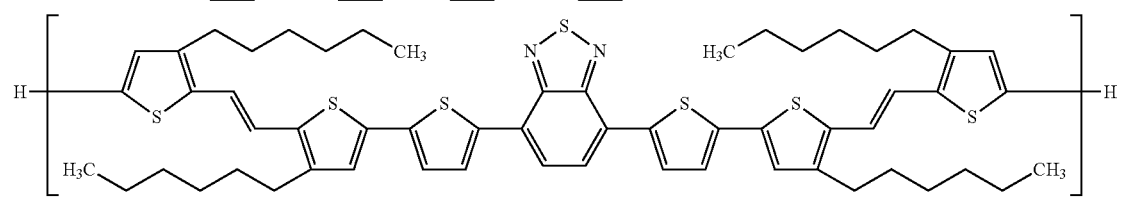
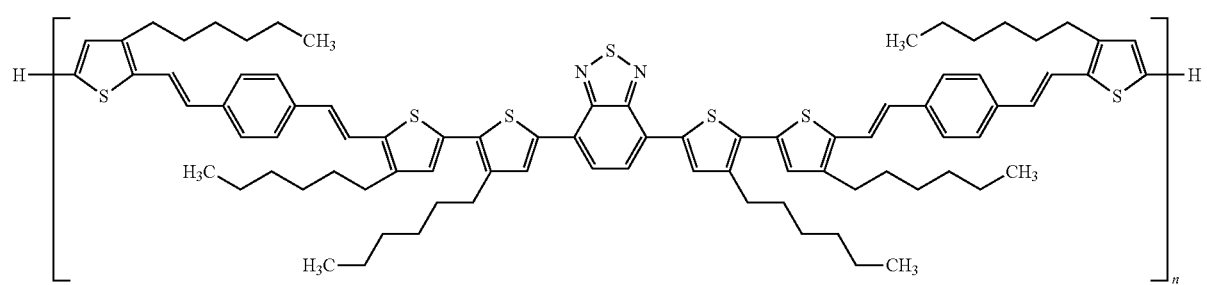

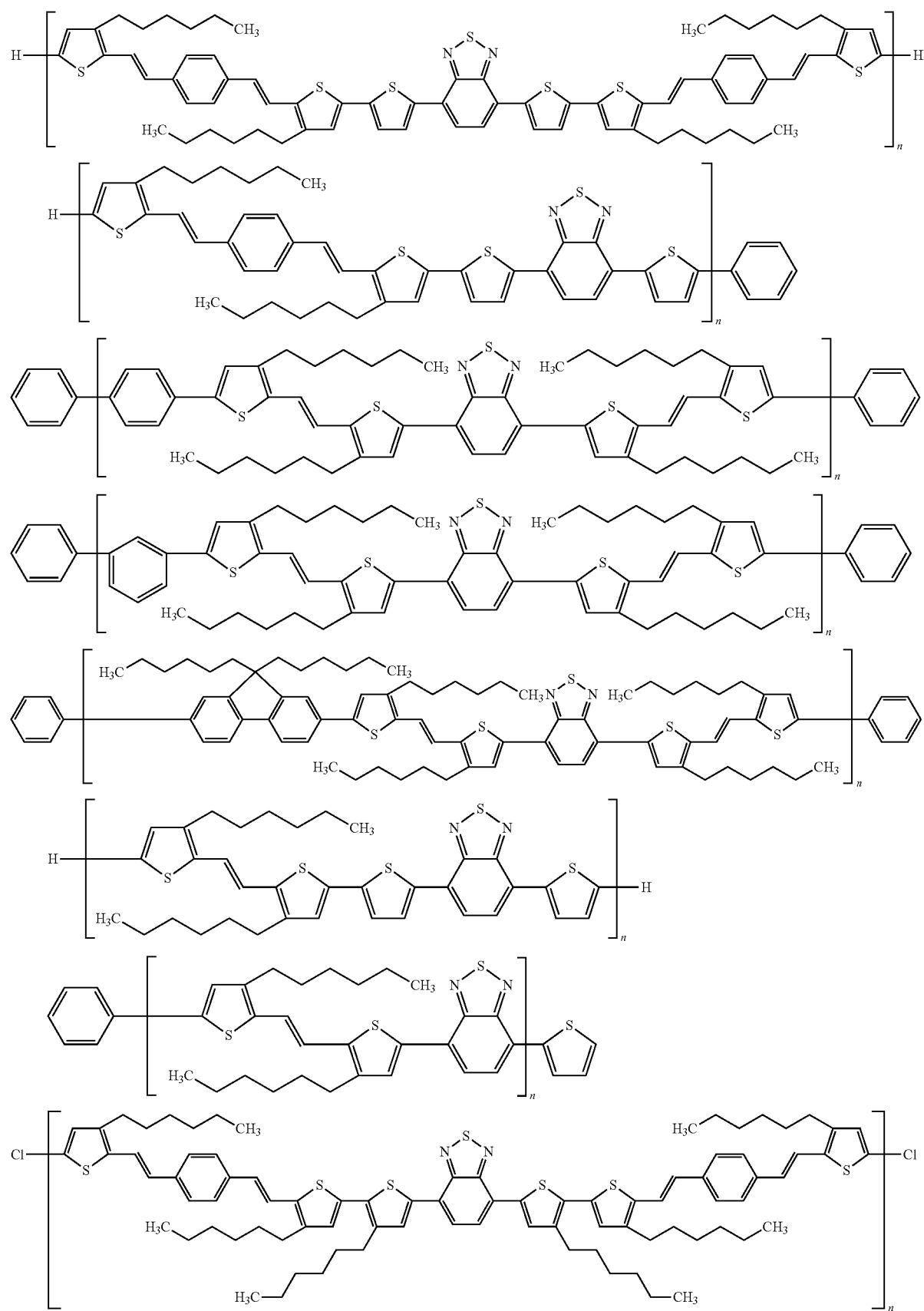

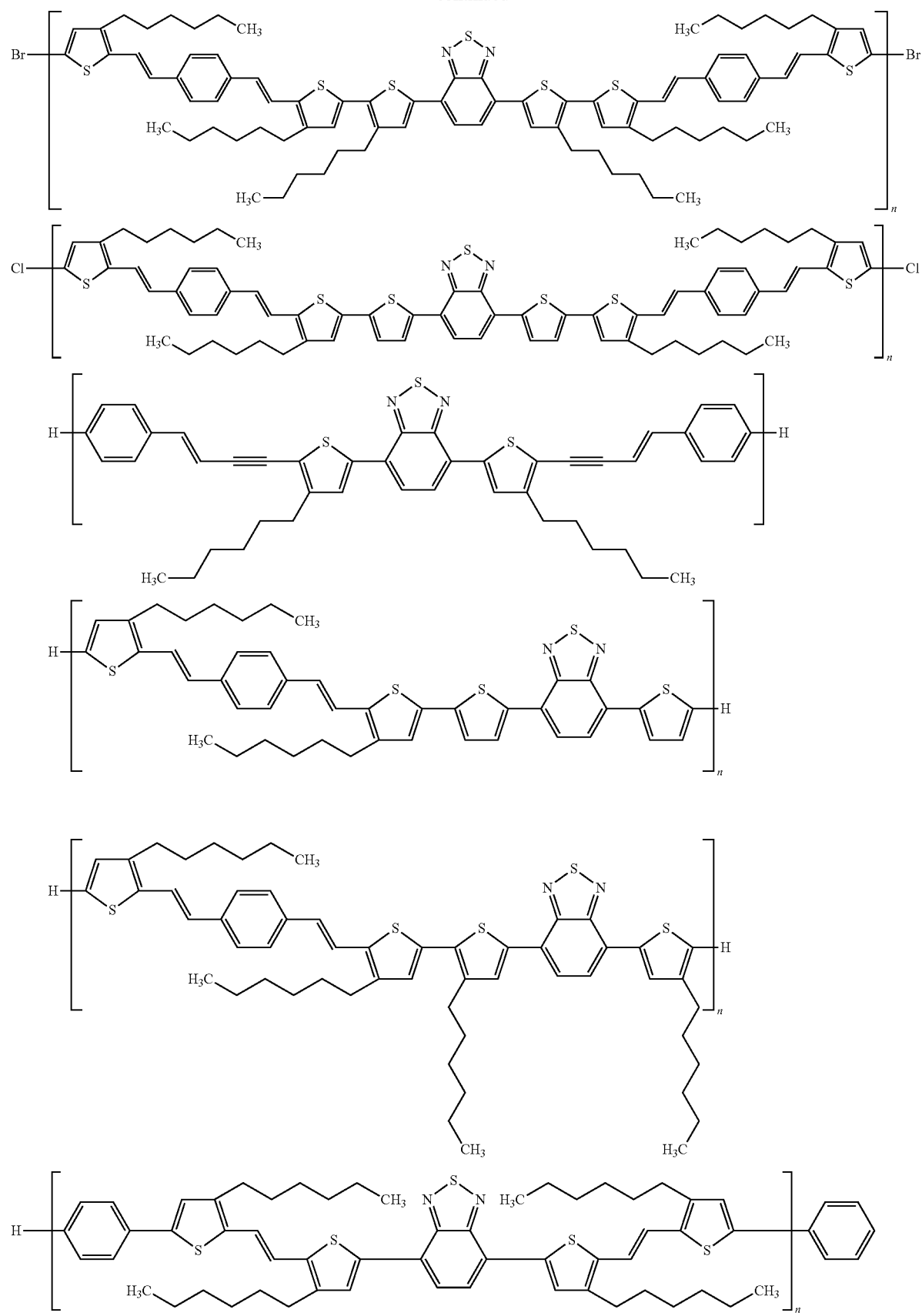

-continued

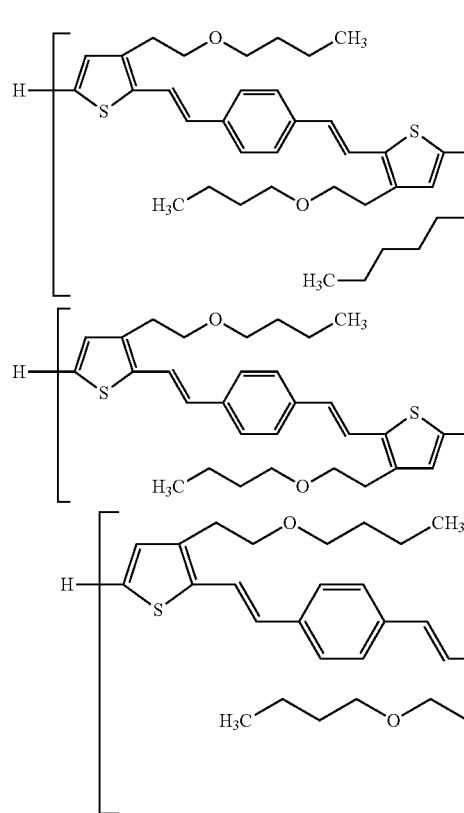
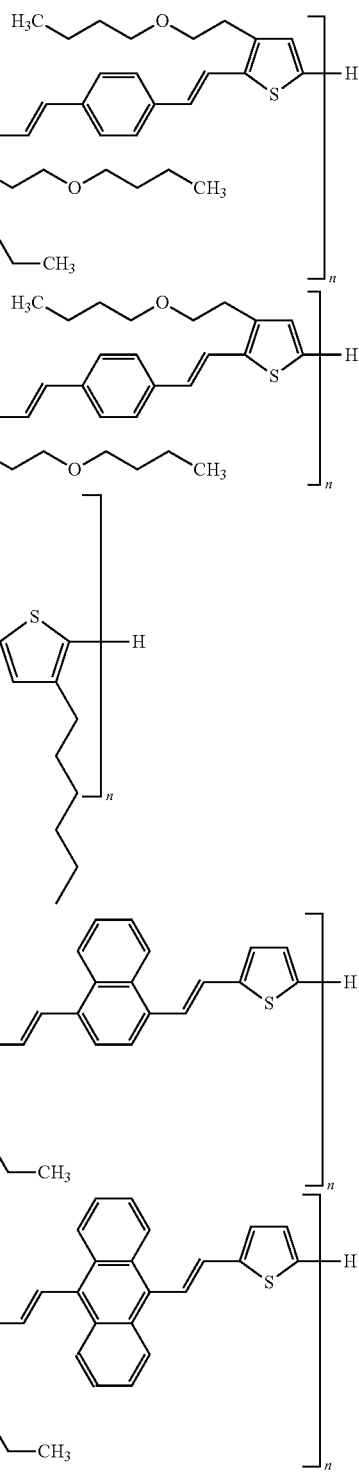
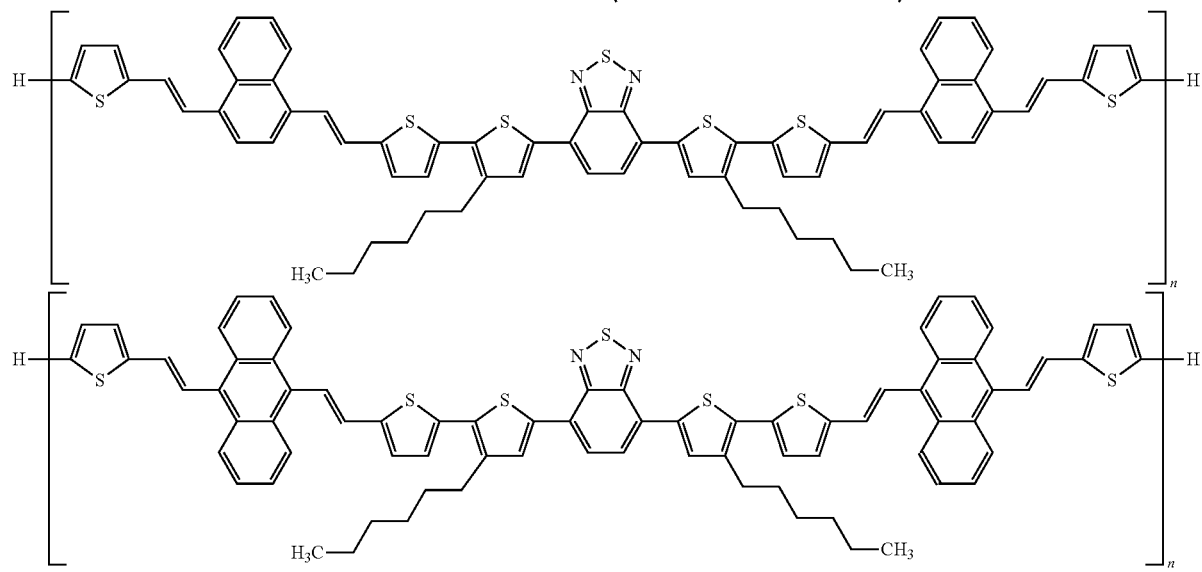

The conjugated polymer represented by formula (1) can be synthesized, for example, by the method disclosed in "Advanced Functional Materials," Vol. 15, pp. 1547-1552, 2005, the subject matter of which is incorporated herein by reference. One example is a method by which dibromobenzothiadiazole and a boronic acid ester derivative obtained by making (E)-1,2-bis (2-thienyl)ethylene derivative act on n-butyl lithium are caused to react together by the Suzuki coupling method using a palladium catalyst and the resulting product is subjected to oxidation polymerization by using iron(III) chloride.

The conjugated polymer represented by formula (1) or formula (2) exhibits a p-type semiconductor property. Therefore, to obtain a higher photoelectric conversion efficiency, it is preferable to combine the conjugated polymer with an electron accepting organic material, which is an n-type organic semiconductor and may hereinafter be referred to as an acceptor material. The material for photovoltaic devices contains the donor material and an acceptor material.

The acceptor material may be an organic material which exerts an n-type semiconductor property. Examples thereof include 1,4,5,8-naphthalenetetracarboxylic dianhydride (NTCDA), 3,4,9,10-perylenetetracarboxylic dianhydride (PTCDA), 3,4,9,10-perylenetetracarboxylic bisbenzimidazole (PTCBI), N,N'-dioctyl-3,4,9,10-naphthyltetracarboxydiimide (PTCDI-C8H), oxazole derivatives such as 2-(4-biphenylyl)-5-(4-tert-butylphenyl)-1,3,4-oxadiazole (PBD) and 2,5-di(1-naphthyl)-1,3,4-oxadiazole (BND), triazole derivatives such as 3-(4-biphenylyl)-4-phenyl-5-(4-tert-butylphenyl)-1,2,4-triazole (TAZ), phenanthroline derivatives, phosphine oxide derivatives, fullerene compounds (unsubstituted compounds such as $C_{60}$, $C_{70}$, $C_{76}$, $C_{78}$, $C_{82}$, $C_{84}$, $C_{90}$ and $C_{94}$, [6,6]-phenyl C61 butyric acid methyl ester ([6,6]-PCBM), [5,6]-phenyl C61 butyric acid methyl ester ([5,6]-PCBM), [6,6]-phenyl C61 butyric acid hexyl ester ([6,6]-PCBH), [6,6]-phenyl C61 butyric acid dodecyl ester ([6,6]-PCBD), phenyl C71 butyric acid methyl ester ($PC_{70}BM$), phenyl C85 butyric acid methyl ester ($PC_{84}BM$), and the like), carbon nanotube (CNT), and a derivative (CN-PPV) resulting from introduction of a cyano group into a poly-p-phenylene vinylene-based polymer. In particular, fullerene compounds are used preferably because they are high in charge separation rate and electron transfer rate. Among the fullerene compounds, $C_{70}$ derivatives (for example, the above-mentioned $PC_{70}BM$) are more preferred because they are excellent in light absorption property and can afford a high photoelectric conversion efficiency.

While the proportions (weight fractions) of the conjugated polymer represented by formula (1), which may hereinafter be referred to as a "conjugated polymer" (a), and an acceptor material in the material for photovoltaic devices are not particularly limited, it is preferable that the weight fraction of the conjugated polymer represented by formula (1): the acceptor material be within the range of 1-99: 99-1, more preferably be within the range of 10-90: 90-10, and even more preferably be within the range of 20-50: 80-50. It is preferable that the conjugated polymer (a) and the acceptor material be used after being mixed. While the mixing method is not particularly restricted, it may be a method in which both the materials are added at a desired ratio to a solvent and then dissolved in the solvent by, solely or in combination, heating, stirring, ultrasonic irradiation, and the like. It is noted that when a material for photovoltaic devices forms one organic semiconductor layer as described below, the above-mentioned proportions are the proportions of the conjugated polymer (a) and the acceptor material contained in the layer, whereas when an organic semiconductor layer has a layered structure containing two or more layers, the proportions mean the proportions of the conjugated polymer (a) and the acceptor material contained throughout the organic semiconductor layer.

To increase the photoelectric conversion efficiency, it is preferable to remove impurities which will serve as a trap of a carrier, as much as possible. While the method for removing impurities from the conjugated polymer represented by formula (1) and the acceptor material is not particularly restricted, column chromatography method, recrystallization method, sublimation method, reprecipitation method, Soxhlet extraction method, filtration method, ion exchange method, chelation method, and the like can be used. Generally, column chromatography method, recrystallization method and sublimation method are preferably used for the purification of low molecule weight organic materials. On the other hand, in the purification of high molecular weight materials, reprecipitation method and Soxhlet extraction method are used preferably when removing low molecular weight components. When removing metal components, reprecipitation method, chelation method and ion exchange method are used preferably. These methods may be used solely or in combination without any particular limitation.

The photovoltaic device has at least a positive electrode and a negative electrode and also has a material for photovoltaic devices between the electrodes. FIG. 1 is a schematic diagram which illustrates one example of the photovoltaic device. In FIG. 1, symbol 1 indicates a substrate. Symbol 2 indicates a positive electrode, and symbol 3 indicates an organic semiconductor layer containing a conjugated polymer represented by formula (1) and an acceptor material. Symbol 4 indicates a negative electrode.

Figure 2:
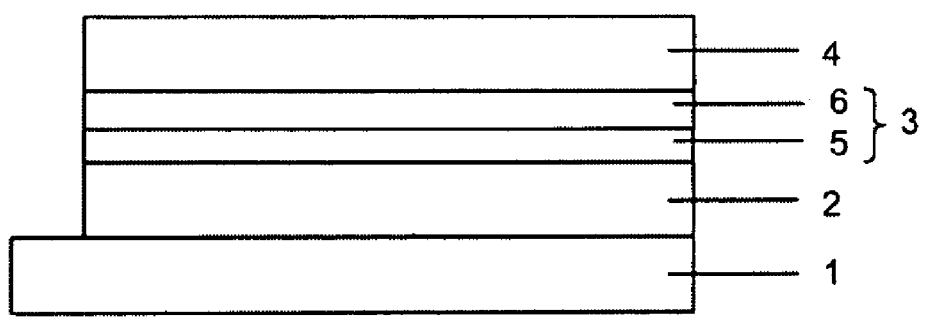
FIG. 2 is a schematic diagram which illustrates another aspect of our photovoltaic devices.

The organic semiconductor layer 3 contains a material for photovoltaic devices. The conjugated polymer represented by formula (1) and the acceptor material may be either mixed or layered. When having been mixed, the conjugated polymer (a) and the acceptor material have been dissolved together at the molecular level or have been phase-separated. While the phase separation structure is not particularly limited in domain size, it ordinarily has a size of 1 nm to 50 nm. When being laminated, it is preferable that the layer having the conjugated polymer (a), which exhibits a p-type semiconductor property, be located on the positive electrode side, and the layer having the acceptor material, which exhibits an n-type semiconductor property, be located on the negative electrode side. One example of the photovoltaic device in which an organic semiconductor layer 3 is laminated is illustrated in FIG. 2. Symbol 5 indicates a layer which contains a conjugated polymer represented by formula (1) and symbol 6 indicates a layer which contains an acceptor material. The organic semiconductor layer preferably is 5 nm to 500 nm, and more preferably is 30 nm to 300 nm in thickness. When being laminated, the layer containing the conjugated polymer represented by formula (1) preferably has a thickness of 1 nm to 400 nm and more preferably has a thickness of 15 nm to 150 nm, in the aforementioned thicknesses.

The organic semiconductor layer 3 may contain a donor material (p-type organic semiconductor) other than conjugated polymers represented by formula (1) and acceptor materials. The donor material (p-type organic semiconductor) to be used here is not particularly limited. Examples thereof include conjugated polymers such as polythiophene-based polymers, poly-p-phenylene vinylene-based polymers, poly-p-phenylene-based polymers, polyfluorene-based polymers, polypyrrole-based polymers, polyaniline-based polymers, polyacetylene-based polymers and polythienylene vinylene-based polymers, and low molecular weight organic compounds including phthalocyanine derivatives such as $H_2$ phthalocyanine ($H_2Pc$), copper phthalocyanine (CuPc) and zinc phthalocyanine (ZnPc), porphyrin derivative, triarylamine derivatives such as N,N'-diphenyl-N,N'-di(3-methylphenyl)-4,4'-diphenyl-1,1'-diamine (TPD) and N,N'-dinaphthyl-N,N'-diphenyl-4,4'-diphenyl-1,1'-dianine (NPD), carbazole derivatives such as 4,4'-di(carbazol-9-yl)biphenyl (CBP), oligothiophene derivatives (terthiophene, quarterthiophene, sexithiophene, octithiophene, and the like).

As to the substrate 1 illustrated in FIG. 1, a substrate on which an electrode material or an organic semiconductor layer can be formed can be used depending on the type or the application of the photoelectric conversion material. For example, a film or a plate prepared by an arbitrary method from an inorganic material such as alkali-free glass and quartz glass or an organic material such as polyester, polycarbonate, polyolefin, polyamide, polyimide, polyphenylene sulfide, polyparaxylene, epoxy resin and fluororesin can be used.

When using it while causing a light to enter from the substrate side, it is preferable to cause each of the substrates described above to have a light transmittance of about 80%. The light transmittance in the present invention is a value calculated from [transmitted light intensity $(W/m^2)$/incident light intensity $(W/m^2)$]×100 (%).

A hole transport layer may be provided between the positive electrode 2 and the organic semiconductor layer 3. Conducting polymers such as a polythiophene-based polymers, poly-p-phenylene vinylene-based polymer and polyfluorene-based polymers and low molecular weight organic compounds capable of exhibiting a p-type semiconductor property such as phthalocyanine derivatives ($H_2Pc$, CuPc, ZnPc, and the like) and porphyrin derivatives are used preferably as the material which forms a hole transport layer. In particular, poly(ethylene-dioxythiophene) (PEDOT), which is a polythiophene-based polymer, and a material containing PEDOT and poly(styrenesulfonate) (PSS) are used preferably. The hole transport layer preferably is 5 nm to 600 nm, and more preferably is 30 nm to 600 nm in thickness.

In the photovoltaic device, an electron transport layer may be provided between the organic semiconductor layer 3 and the negative electrode 4. While the material for forming the electron transport layer is not particularly limited, the organic materials described above capable of exhibiting an n-type semiconductor property, such as acceptor materials (NTCDA, PTCDA and PTCDI-C8H, oxazole derivatives, triazole derivatives, phenanthroline derivatives, phosphine oxide derivatives, fullerene compounds, CNT and CN-PPV, and the like) are used preferably. The electron transport layer preferably is 5 nm to 600 nm, and more preferably is 30 nm to 600 nm in thickness.

In the photovoltaic device, it is preferable that the positive electrode 2 or the negative electrode 4 have light transmittance. The light transmittance of an electrode thin film is not particularly limited if it is as much as an incident light reaches the organic semiconductor layer 3 to generate an electromotive force. The thickness of the electrode thin film, which should just be within a range such that the film can have both light transmittance and conductivity and which may vary depending upon the electrode material, preferably is from 20 to 300 nm. The other electrode is not necessarily required to be transparent if it is conductive, and it is not limited with respect to its thickness.

Regarding the electrode material, it is preferable to use a conductive material with a large work function for one electrode and a conductive material with a small work function for another electrode. The electrode comprising the conductive material with a large work function serves as a positive electrode. Metals such as gold, platinum, chromium and nickel, transparent metal oxides of indium, tin, and the like, and composite metal oxides (indium tin oxide (ITO) and indium zinc oxide (IZO), and the like) are used preferably as the material with a large work function. The conductive material to be used for the positive electrode 2 preferably is a material which can form ohmic contact with the organic semiconductor layer 3. In the case of using a hole transport layer, the conductive material to be used for the positive electrode 2 preferably is a material which can form ohmic contact with the hole transport layer.

While the electrode comprising a conductive material with a small work function serves as a negative electrode, alkali metals and alkaline earth metals such as lithium, magnesium and calcium are used as the conductive material with a small work function. Tin, silver and aluminum are also used preferably. Moreover, electrodes made of alloys composed of the aforementioned metals or electrodes made of laminates of the aforementioned metals are also used preferably introduction of a metal fluoride or the like to the interface between the negative electrode 4 and the electron transport layer makes it possible to increase the extracted current. The conductive material to be used for the negative electrode 4 preferably is a material which can form ohmic contact with the organic semiconductor layer 3. In the case of using an electron transport layer, the conductive material to be used for the negative electrode 4 preferably is a material which can form ohmic contact with the electron transport layer.

Next, the method for producing the photoelectric converting device is described. A transparent electrode such as ITO, which in this case corresponds to a positive electrode, is formed on a substrate by sputtering method or the like. Next, a solution is prepared by dissolving a material for photovoltaic devices containing a conjugated polymer (a) represented by formula (1) and an acceptor material in a solvent, and then an organic semiconductor layer is formed by applying the solution to a transparent electrode. The solvent used for this purpose preferably is an organic solvent and examples thereof include methanol, ethanol, butanol, toluene, xylene, o-chlorophenol, acetone, ethyl acetate, ethylene glycol, tetrahydrofuran, dichloromethane, chloroform, dichloroethane, chlorobenzene, dichlorobenzene, trichlorobenzene, chloronaphthalene, dimethylformamide, dimethyl sulfoxide, N-methylpyrrolidone and γ-butyrolactone.

When an organic semiconductor layer is formed by mixing a conjugated polymer represented by formula (1) and an acceptor material, a solution is prepared by adding a conjugated polymer (a) and an acceptor material at a desired ratio to a solvent and dissolving them with a technique such as heating, stirring and ultrasonic irradiation, and then the solution is applied to a transparent electrode. When an organic semiconductor layer is formed by providing a conjugated polymer represented by formula (1) and an acceptor material in layer, a solution of the conjugated polymer (a) represented by formula (1), for example, is applied to form a layer containing the conjugated polymer (a) and then a solution of the acceptor material is applied to form a layer. When the conjugated polymer represented by formula (1) and the acceptor material are low molecular weight substances having a molecular weight of about 1000 or less, it is also possible to form a layer by vapor deposition.

For the formation of an organic semiconductor layer, any method can be used, e.g., spin coating, blade coating, slit die coating, screen printing, bar coater coating, mold coating, a print transfer method, a dipping and picking method, an inkjet method, spraying and vacuum deposition method. The forming method may be selected depending upon the intended characteristics of the organic semiconductor layer, e.g., film thickness control and orientation control. For example in spin coating, it is preferable that the conjugated polymer represented by formula (1) and the acceptor material be in a concentration of 1 to 40 g/l (the weight of the conjugated polymer (a) and the acceptor material to the volume of the solution containing the conjugated polymer (a), the acceptor material and the solvent). By using this concentration, it is possible to obtain a uniform organic semiconductor layer having a thickness of 5 to 200 nm. The formed organic semiconductor layer may be subjected to annealing treatment under reduced pressure or under an inert atmosphere (e.g., under a nitrogen or argon atmosphere) for the purpose of removing the solvent. A preferable temperature of the annealing treatment is 40° C. to 300° C., and more preferably is 50° C. to 200° C. Moreover, by performing the annealing treatment, the execution area at which the laminated layers permeate mutually at their interface and come into contact with each other and, as a result, it is possible to increase the short-circuit current. The annealing treatment may be done after the formation of a negative electrode.

Next, a metal electrode such as Al, which corresponds to a negative electrode in this case, is formed on the organic semiconductor layer by vacuum deposition method or sputtering method. When vacuum deposition is performed using a low molecular weight organic material in the electron transfer layer, it is preferable to continue to form the metal electrode while maintaining the vacuum.

When a hole transport layer is provided between a positive electrode and an organic semiconductor layer, a desired p-type organic semiconductor material (such as PEDOT) is applied to the positive electrode by spin coating method, bar coating method, casting method with a blade, or the like, and then the solvent is removed by the use of a vacuum thermostat, a hot plate, and the like, resulting in the formation of the hole transport layer. When using a low molecular weight organic material such as a phthalocyanine derivative and a porphyrin derivative, it is also possible to apply vacuum deposition method using a vacuum deposition machine.

When an electron transport layer is provided between a negative electrode and an organic semiconductor layer, a desired n-type organic semiconductor material (such as fullerene derivative) is applied to the organic semiconductor layer by spin coating method, bar coating method, casting method with a blade, spraying or the like, and then the solvent is removed by the use of a vacuum thermostat, a hot plate, and the like, resulting in the formation of the electron transport layer. When using a low molecular weight organic material such as a phenanthroline derivative and $C_{60}$, it is also possible to apply vacuum deposition method using a vacuum deposition machine.

EXAMPLES

Our materials and devices are hereafter described more specifically on the basis of examples. However, the disclosure is not limited to the examples. The compounds used in the example are given below:

| | |
|---|---|
| ITO: | indium tin oxide |
| PEDOT: | poly(ethylenedioxythiophene) |
| PSS: | poly(styrenesulfonate) |
| P3HT: | poly(3-hexylthiophene) |
| PCBM: | phenyl C61 butyric acid methyl ester |
| PC$_{70}$BM: | phenyl C71 butyric acid methyl ester. |

For the $^1$H-NMR measurement was used an FT-NMR analyzer (JEOL JNM-EX270 manufactured by JEOL Ltd.). Average molecular weights (a number average molecular weight and a weight average molecular weight) were determined by the use of the absolute calibration method using a GPC analyzer (a high performance GPC apparatus HLC-8220GPC manufactured by TOSOH Corp. in which chloroform was caused to pass). The polymerization degree n was calculated by the following formula:

Polymerization degree $n$=[(Weight average molecular weight)/(Molecular weight of a monomer unit)].

Synthesis Example 1

Compound A-1 was synthesized by the method illustrated in Scheme 1.

Formula 1

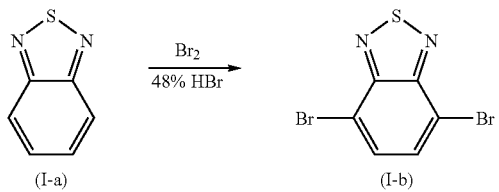

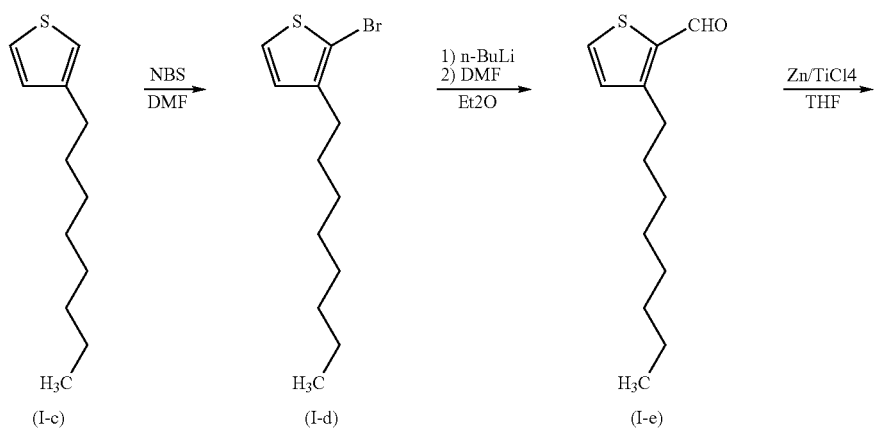

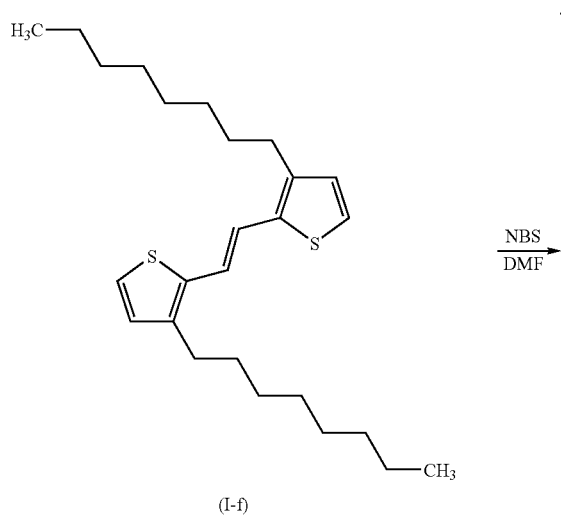

(I-f)

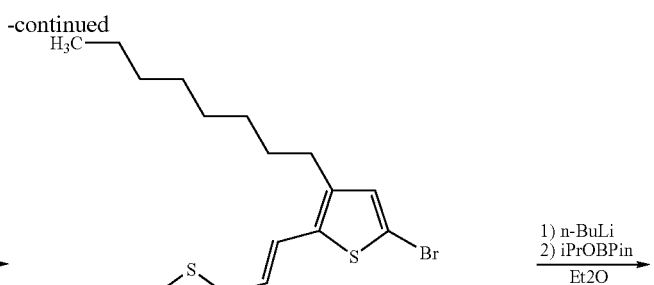

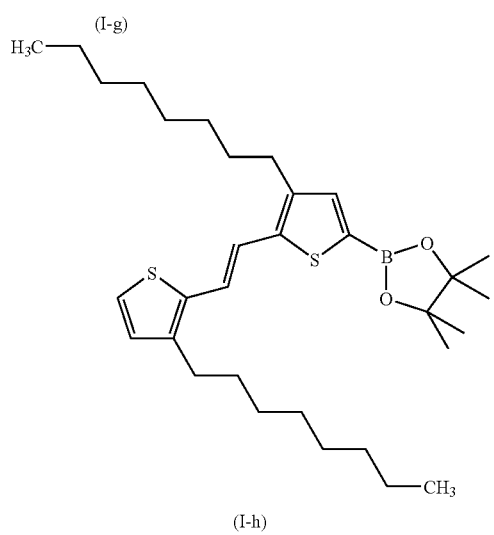

(I-h)

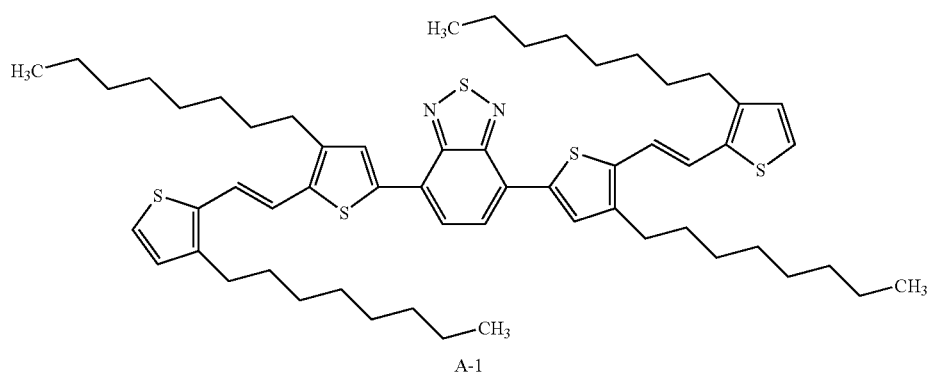

A-1

To 150 ml of 48% hydrobromic acid (produced by Wako Pure Chemical Industries, Ltd.) were added 4.3 g of compound (1-a) (produced by Tokyo Chemical Industry Co., Ltd.) and 10 g of bromine (produced by Wako Pure Chemical Industries, Ltd.) and followed by stirring at 120° C. for 3 hours. After cooling to room temperature, the formed solid was collected on a glass filter by filtration, and then washed with 1000 ml of water and 100 ml of acetone. The resulting solid was dried in vacuo at 60° C. to afford 6.72 g of compound (1-b).

In 120 ml of dimethylformamide (produced by Kishida Chemical Co., Ltd.) was dissolved 10.53 g of compound (1-c) (produced by Tokyo Chemical Industry Co., Ltd.), and then 10.5 g of N-bromosuccinimide (produced by Tokyo Chemical Industry Co., Ltd.) was added and followed by stirring under a nitrogen atmosphere at room temperature for 6 hours. To the resulting solution were added 100 ml of water and 100 ml of n-hexane. Then, the organic layer was separated, washed with 100 ml of water, and then dried over magnesium sulfate. The solvent was removed from the resulting solution by evaporation under reduced pressure with a rotary evaporator to afford 15 g of compound (1-d).

In 100 ml of diethyl ether (produced by Wako Pure Chemical Industries, Ltd.) was dissolved 15 g of the compound (1-d), and then was cooled to −100° C. After the addition of 35 ml of a 1.6 M n-butyl lithium solution in hexane (produced by Wako Pure Chemical Industries, Ltd.), the temperature was increased to −60° C. and then 6.2 ml of dimethylformamide (produced by Kishida Chemical Co., Ltd.) was added. The temperature was increased to room temperature and then stirring was conducted under a nitrogen atmosphere for 2 hours. To the resulting solution were added 200 ml of a 1 N aqueous solution of ammonium chloride and 100 ml of dichloromethane. Then, the organic layer was separated, washed with 100 ml of water, and then dried over magnesium sulfate. The resulting solution was purified by column chromatography (filler: silica gel, eluent: dichloromethane) to yield 12.1 g of compound (1-e).

To 200 ml of tetrahydrofuran (produced by Wako Pure Chemical Industries, Ltd.) was added 8.47 g of zinc powder (produced by Wako Pure Chemical Industries, Ltd.) and then were added 7.1 ml of titanium tetrachloride (produced by Wako Pure Chemical Industries, Ltd.) and 12.1 g of the compound (1-e) at 0° C. After refluxing for 1 hour under a nitrogen atmosphere under heating, the resulting solution was added to 1500 ml of ice water, and then 300 ml of dichloromethane was further added. The organic layer was separated, washed with 100 ml of water, and then dried over magnesium sulfate. The resulting solution was purified by column chromatography (filler: silica gel, eluent: hexane) to yield 7.47 g of compound (1-f).

In 100 ml of dimethylformamide (produced by Kishida Chemical Co., Ltd.) was dissolved 7.47 g of the compound (1-f), and then 3.5 g of N-bromosuccinimide (produced by Tokyo Chemical Industry Co., Ltd.) was added and followed by stirring under a nitrogen atmosphere at room temperature for 4 hours. To the resulting solution were added 100 ml of water, 100 ml of n-hexane and 100 ml of dichloromethane. Then, the organic layer was separated, washed with 100 ml of water, and then dried over magnesium sulfate. The resulting solution was purified by column chromatography (filler: silica gel, eluent: hexane) to yield 6.32 g of compound (1-g).

In 70 ml of diethyl ether (produced by Wako Pure Chemical Industries, Ltd.) was dissolved 5.4 g of the compound (1-g), and then was cooled to −100° C. After the addition of 7.5 ml of a 1.6 M n-butyl lithium solution in hexane (produced by Wako Pure Chemical Industries, Ltd.), the temperature was increased to −60° C. and then 1.7 g of 2-isopropoxy-4,4,5,5-tetramethyl-1,3,2-dioxaborolane (produced by Wako Pure Chemical Industries, Ltd.) was added. The temperature was increased to room temperature and then stirring was conducted under a nitrogen atmosphere for 24 hours. To the resulting solution were added 100 ml of water and 100 ml of dichloromethane. Then, the organic layer was separated, washed with 100 ml of water, and then dried over magnesium sulfate. The resulting solution was purified by column chromatography (filler: silica gel, eluent: dichloromethane/hexane) to yield 2.36 g of compound (1-h).

To 40 ml of dimethylformamide (produced by Kishida Chemical Co., Ltd.) were added 0.511 g of the compound (1-b) and 2.36 g of the compound (1-h). Then, 1.5 g of potassium phosphate (produced by Wako Pure Chemical Industries, Ltd.), 0.23 g of tetrabutylammonium bromide (produced by Wako Pure Chemical Industries, Ltd.), and 16 mg of palladium acetate (produced by Wako Pure Chemical Industries, Ltd.) were added under a nitrogen atmosphere and followed by stirring at 120° C. for 5 hours. To the resulting solution were added 100 ml of water and 100 ml of dichloromethane. Then, the organic layer was separated, washed with 100 ml of water, and then dried over magnesium sulfate. The resulting solution was purified by column chromatography (filler: silica gel, eluent: dichloromethane/hexane) to yield 0.85 g of compound A-1. The $^1$H-NMR measurement of compound A-1 is shown:

$^1$H-NMR (CDCl$_2$, ppm): 7.97 (s, 2H), 7.83 (s, 2H), 7.09 (m, 6H), 6.87 (d, 2H), 2.73 (m, 8H), 1.65 (m, 8H), 1.32 (m, 40H), 0.88 (t, 12H).

Synthesis Example 2

Compound A-2 was synthesized by the method illustrated in Scheme 2.

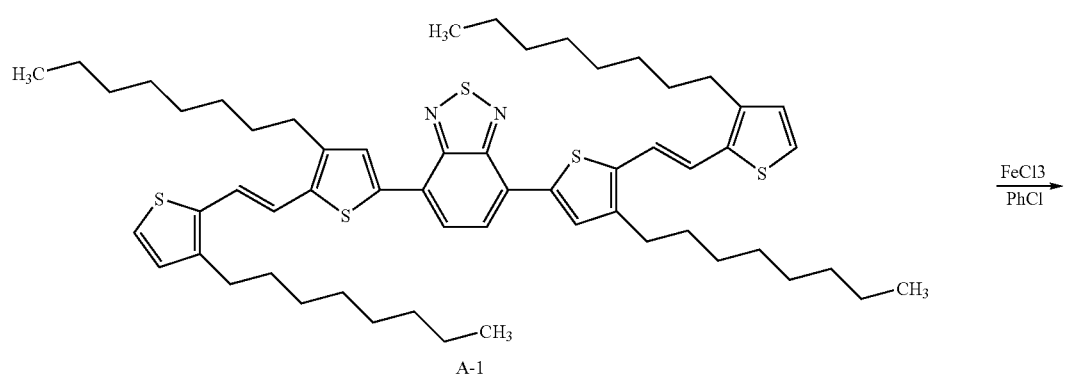

Formula 2

A-1

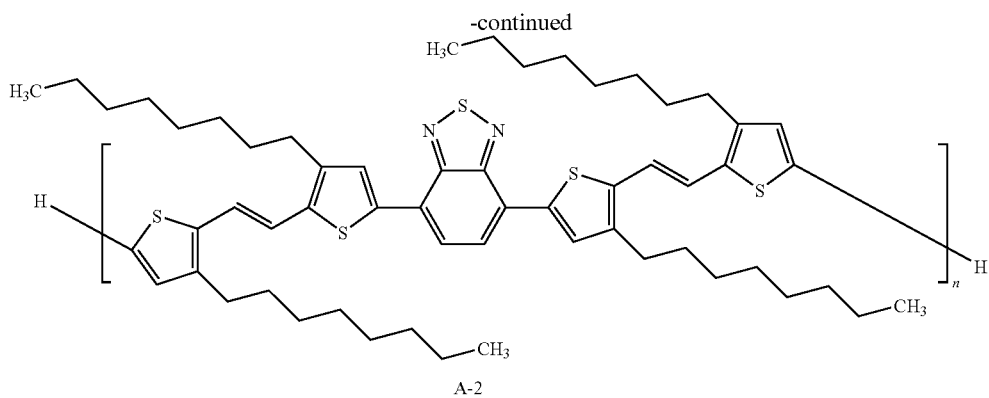

A-2

To 3 ml of chlorobenzene (produced by Aldrich Chemical Company, Inc.) were added 0.3 g of the compound A-1 and 0.11 g of iron (III) chloride (produced by Aldrich Chemical Company, Inc.) and followed by stirring under a nitrogen atmosphere at 80° C. for 133 hours. The resulting solution was diluted with 20 ml of chloroform, and then was poured into a mixed solution of 1000 ml of methanol and 400 ml of a 10 wt % aqueous ammonia solution. The resulting mixed solution was stirred for 3 hours, and then was filtered through a 1 μm membrane filter. The resulting filtration residue was subjected to Soxhlet extraction with methanol, hexane and chloroform, successively. The resulting chloroform solution was condensed with a rotary evaporator and 100 ml of methanol was then added thereto. After filtration through a 0.45 μm membrane filter, the resulting filtration residue was washed with 100 ml of methanol and then dried in vacuo at 60° C. to afford 10 mg of compound A-2. The weight average molecular weight was 7660 and the number average molecular weight was 4540. The polymerization degree n was 7.9.

Synthesis Example 3

Compound A-3 was synthesized by the method illustrated in Scheme 3.

Formula 3

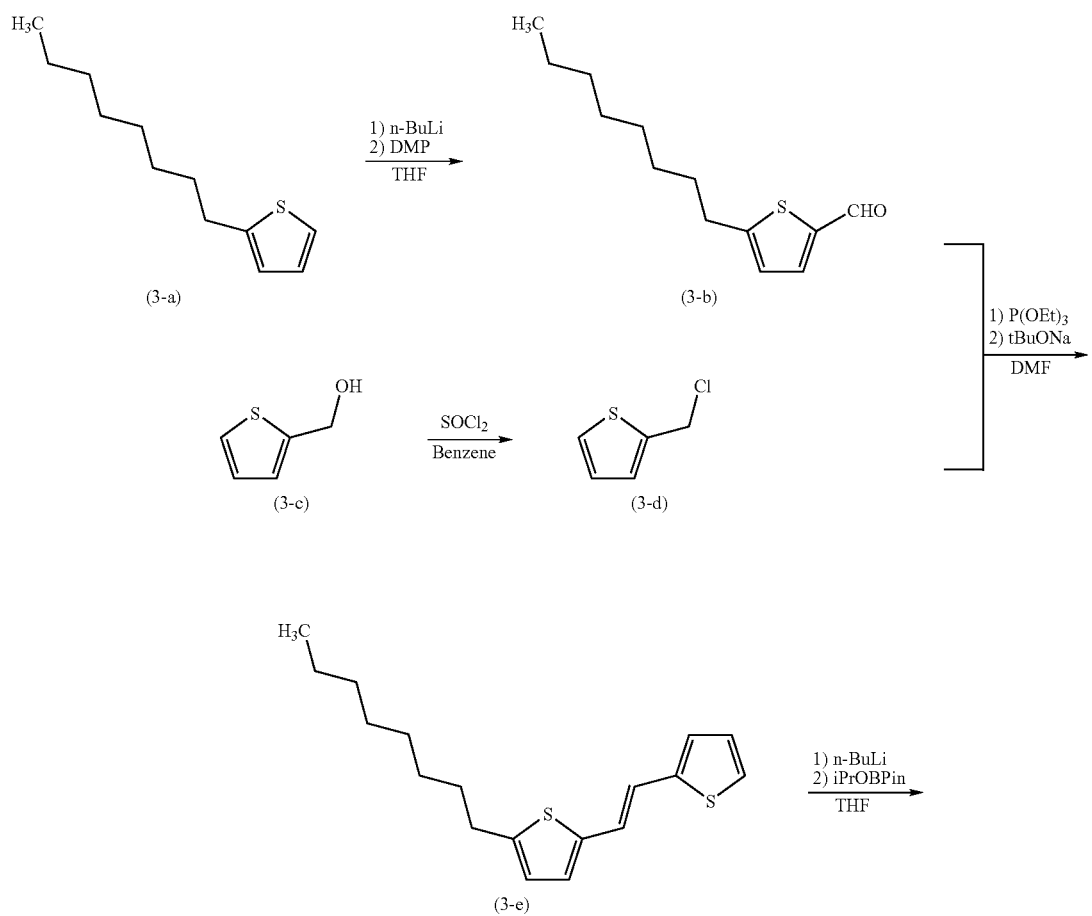

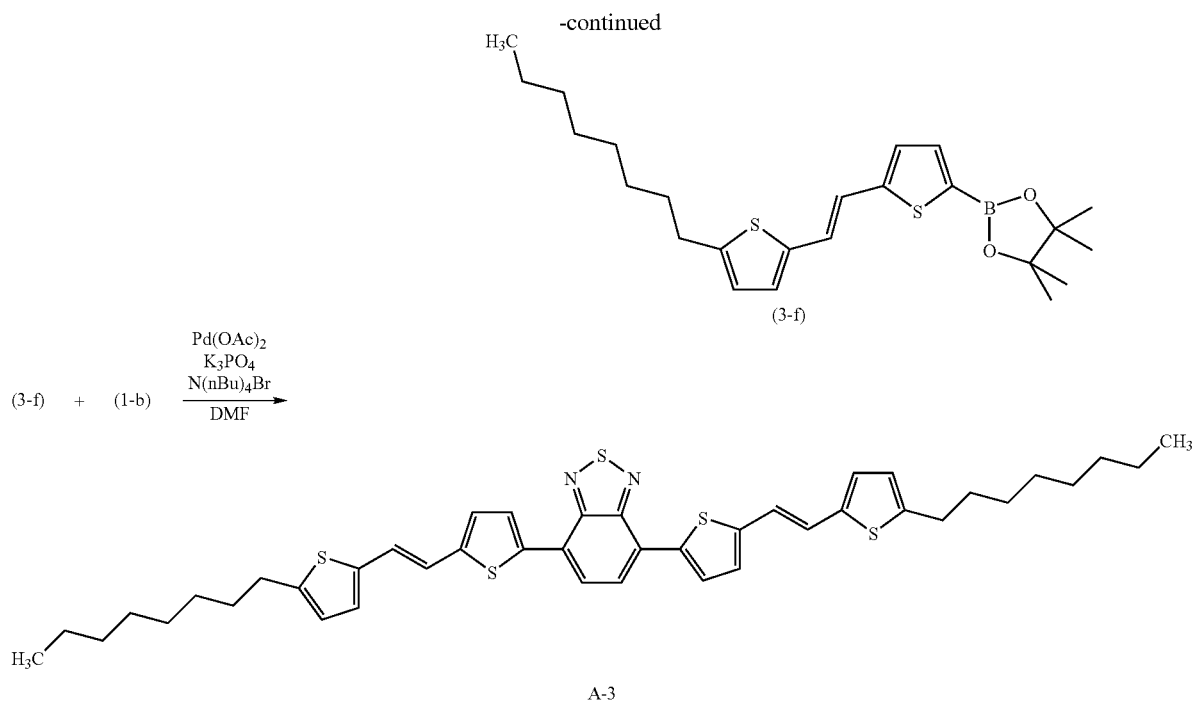

In 60 ml of tetrahydrofuran (produced by Wako Pure Chemical Industries, Ltd.) was dissolved 13 g of compound (3-a) (produced by Wako Pure Chemical industries, Ltd.). After the addition of 46 ml of a 1.6 M n-butyl lithium solution in hexane (produced by Wako Pure Chemical Industries, Ltd.), the resultant was cooled to 0° C. and then 10 ml of dimethylformamide (produced by Kishida Chemical Co., Ltd.) was added. The temperature was increased to room temperature and then stirring was conducted under a nitrogen atmosphere for 4 hours. To the resulting solution were added 150 ml of water and 150 ml of hexane. Then, the organic layer was separated, washed with 100 ml of water, and then dried over magnesium sulfate. The resulting solution was purified by column chromatography (filler: silica gel, eluent: hexane/ethyl acetate) to yield 12.6 g of compound (3-b).

After the dissolving of 25 g of compound (3-C) (produced by Tokyo Chemical Industry Co., Ltd.) in 100 ml of benzene (produced by Wako Pure Chemical Industries, Ltd.) followed by cooling to 0° C., 25 ml of thionyl chloride (produced by Wako Pure Chemical Industries, Ltd.) was added. The temperature was increased to room temperature and then stirring was conducted under a nitrogen atmosphere for 3 hours. The resulting solution was distilled under reduced pressure to afford 23.5 g of compound (3-d).

To 9.3 g of triethyl phosphite (produced by Wako Pure Chemical Industries, Ltd.) was added 7.42 g of the compound (3-d) and followed by stirring under a nitrogen atmosphere at 150° C. for 4 hours. After cooling to room temperature, 120 ml of dimethylformamide (produced by Kishida Chemical Co., Ltd.), 5.8 g of sodium tert-butoxide (produced by Wako Pure Chemical Industries, Ltd.) and 12.6 g of the compound (3-b) were added, and followed by stirring at room temperature for 1 hour. To the resulting solution were added 450 ml of water and 250 ml of hexane. Then, the organic layer was separated, washed with 200 ml of water, and then dried over magnesium sulfate. The resulting solution was purified by column chromatography (filler: silica gel, eluent: hexane) to yield 7 g of compound (3-e).

In 50 ml of tetrahydrofuran (produced by Wako Pure Chemical Industries, Ltd.) was dissolved 7 g of the compound (3-e). Then, 16 ml of a 1.6 M n-butyl lithium solution in hexane (produced by Wako Pure Chemical Industries, Ltd.) was added and followed by stirring under a nitrogen atmosphere at room temperature for 1 hour. Subsequently, 5.1 ml of 2-isopropoxy-4,4,5,5-tetramethyl-1,3,2-dioxaborolane (produced by Wako Pure Chemical Industries, Ltd.) was added and followed by stirring under a nitrogen atmosphere at room temperature for 1 hour. To the resulting solution were added 250 ml of water and 200 ml of chloroform. Then, the organic layer was separated, washed with 300 ml of water, and then dried over magnesium sulfate. The resulting solution was purified by column chromatography (filler: Florisil, eluent: dichloromethane/hexane) to yield 6 g of compound (3-f).

To 50 ml of dimethylformamide (produced by Kishida Chemical Co., Ltd.) were added 0.82 g of the compound (1-b) in Synthesis Example 1 and 3 g of the compound (3-f). Then, 2.38 g of potassium phosphate (produced by Wako Pure Chemical Industries, Ltd.), 0.35 g of tetrabutylammonium bromide (produced by Wako Pure Chemical Industries, Ltd.), and 25 mg of palladium acetate (produced by Wako Pure Chemical Industries, Ltd.) were added under a nitrogen atmosphere and followed by stirring at 120° C. for 2 hours. To the resulting solution were added 250 ml of water and 250 ml of dichloromethane. Then, the organic layer was separated, washed with 200 ml of water, and then dried over magnesium sulfate. The resulting solution was purified by column chromatography (filler: silica gel, eluent: dichloromethane/hexane) to yield 0.75 g of compound A-3. The $^1$H-NMR measurement of compound A-3 is shown:

$^1$H-NMR (CDCl$_2$, ppm): 8.03 (d, 2H), 7.82 (s, 2H), 7.14-6.87 (m, 8H), 6.67 (d, 2H), 2.79 (t, 4H), 1.67 (m, 4H), 1.29 (m, 20H), 0.89 (t, 6H).

Synthesis Example 4

Compound A4 was synthesized by the method illustrated in Scheme 4.

Formula 4
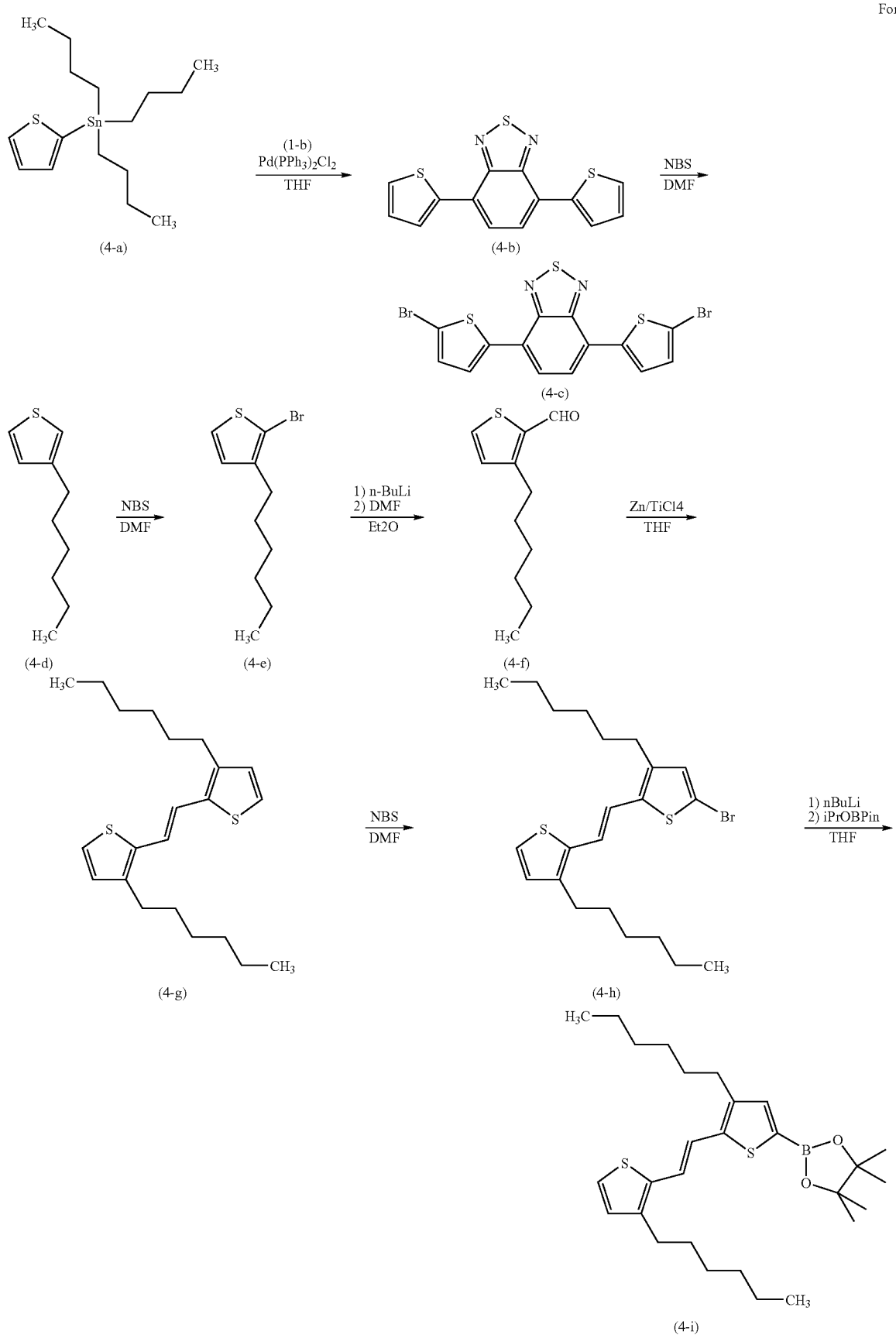

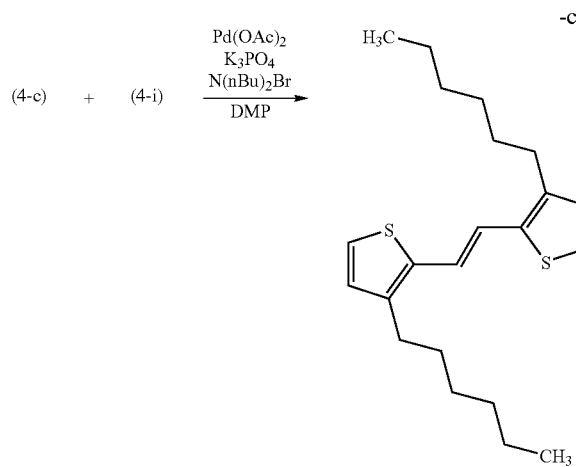
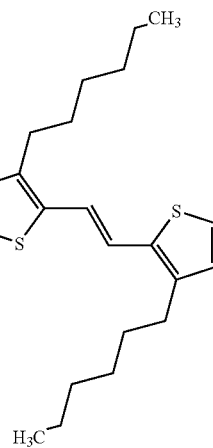

A-4

To 180 ml of tetrahydrofuran (produced by Wako Pure Chemical Industries, Ltd.) were added 6.72 g of the compound (1-b) in Synthesis Example 1 and 20 g of compound (4-a) (produced by Tokyo Chemical Industry Co., Ltd.). Then, under a nitrogen atmosphere, 0.32 mg of bis(triphenylphosphine) palladium dichloride (produced by Tokyo Chemical Industry Co., Ltd.) was added and refluxed for 4 hours under heating. The resulting solution was subjected to removal of tetrahydrofuran under reduced pressure by using a rotary evaporator and subsequent purification by column chromatography (filler: silica gel, eluent: dichloromethane/hexane), yielding 7 g of compound (4-b).

In 100 ml of dimethylformamide (produced by Kisbida Chemical Co., Ltd.) was dissolved 3 g of the compound (4-b), and then 4.44 g of N-bromosuccinimide (produced by Tokyo Chemical Industry Co., Ltd.) was added and followed by stirring under a nitrogen atmosphere at 40° C. for 5 hours. A solid was collected from the resulting suspension by filtration and then washed successively with water, dimethylformamide; methanol and dichloromethane to afford 4.19 g compound (4-c).

To 30 ml of dimethylformamide (produced by Kishida Chemical Co., Ltd.) were added 0.56 g of the compound (4-c) and 1.3 g of compound (4-i) which was synthesized in the same manner as that for the compound (1-h) in Synthesis Example 1 except for using the compound (4-d) instead of the compound (1-c). Then, under a nitrogen atmosphere, 1 g of potassium phosphate (produced by Wako Pure Chemical Industries, Ltd.), 0.15 g of tetrabutylammonium bromide (produced by Wako Pure Chemical Industries, Ltd.), and 11 mg of palladium acetate (produced by Wako Pure Chemical Industries, Ltd.) were added and followed by stirring at 120° C. for 1 hour. To the resulting solution were added 500 ml of water and 300 ml of toluene. Then, the organic layer was separated, washed with 200 ml of water, and then dried over magnesium sulfate. The resulting solution was purified by column chromatography (filler: silica gel, eluent: dichloromethane/hexane) to yield 0.66 g of compound A4. The $^1$H-NMR measurement of compound A4 is shown:

$^1$H-NMR (CDCl$_2$, ppm): 8.02 (d, 2H), 7.82 (s, 2H), 7.23 (d, 2H), 7.09 (d, 2H), 7.06 (s, 2H), 6.99 (d, 2H), 6.86 (d, 21), 2.71-2.62 (m, 8H), 1.75-1.53 (m, 8H), 1.36 (m, 24H), 1.00-0.86 (m, 12H).

Synthesis Example 5

Compound A-5 was synthesized by the method illustrated in Scheme 5.

Formula 5

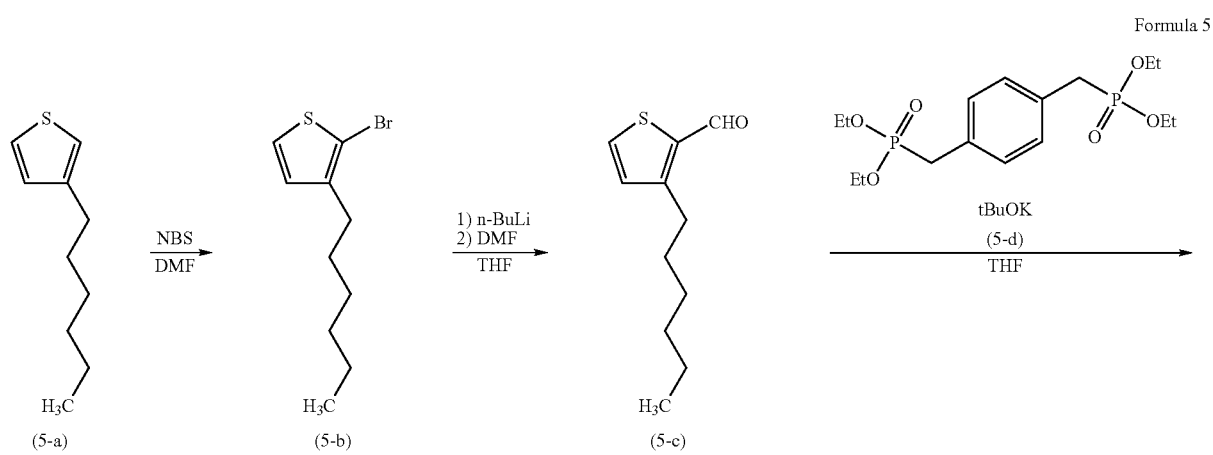

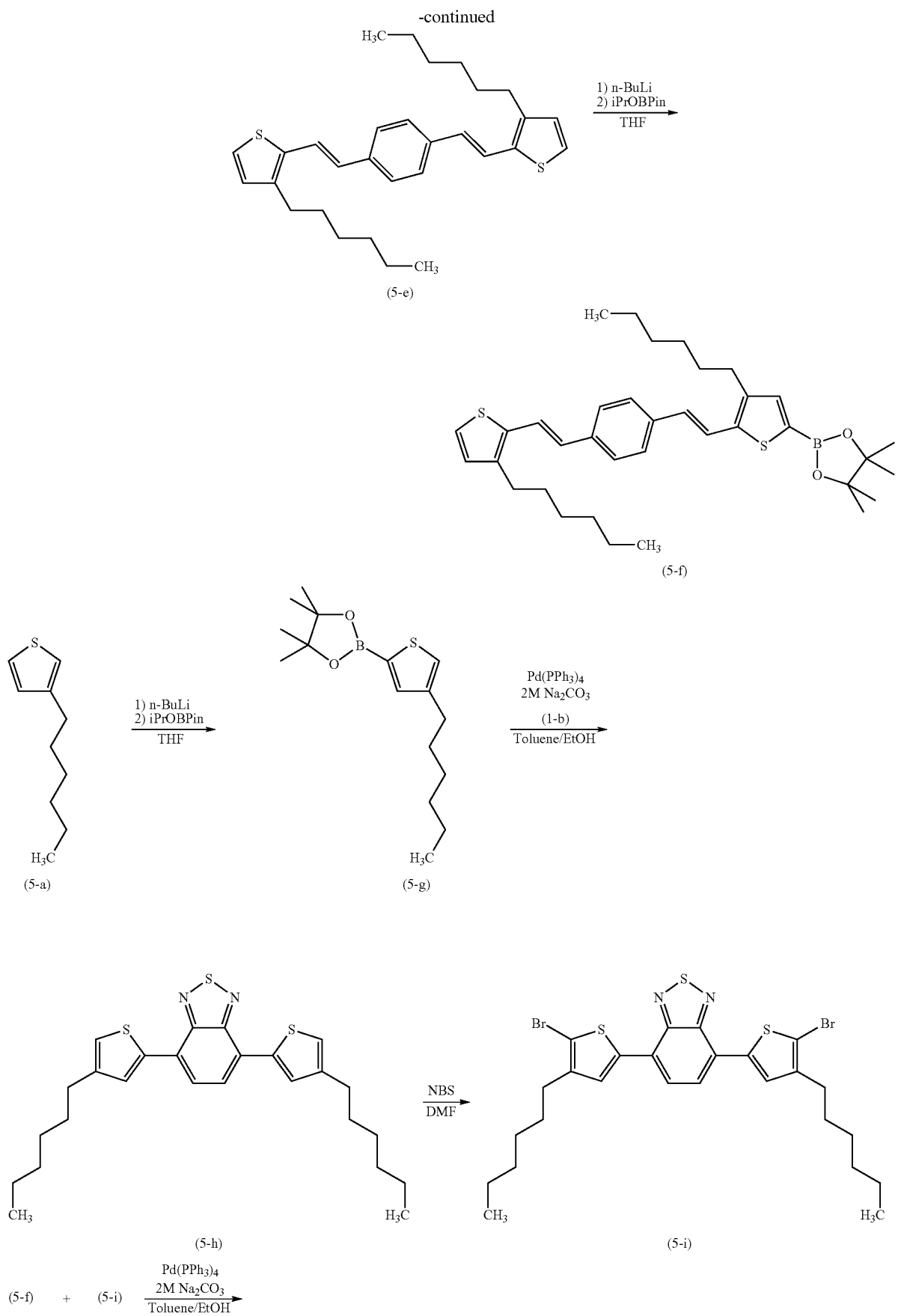

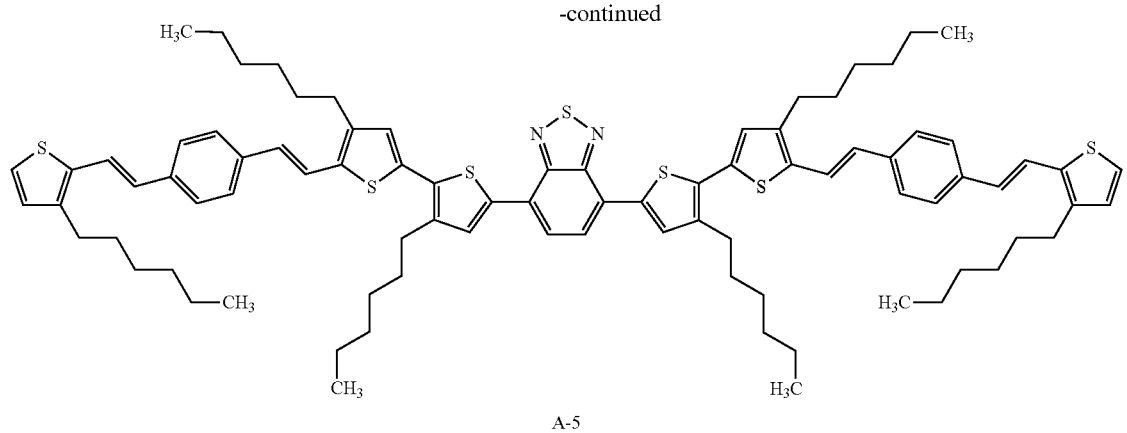

A-5

In 50 ml of dimethylformamide (produced by Wako Pure Chemical Industries, Ltd.) was dissolved 5.2 g of compound (5-a) (produced by Tokyo Chemical Industry Co., Ltd.), and then 6.5 g of N-bromosuccinimide (produced by Wako Pure Chemical Industries, Ltd.) was added and followed by stirring under a nitrogen atmosphere at room temperature for 3 hours. To the resulting solution were added 100 ml of water and 100 ml of ethyl ace-tate. Then, the organic layer was separated, washed with 100 ml of water repeatedly three times, and then dried over magnesium sulfate. The solvent was removed from the resulting solution by evaporation under reduced pressure with a rotary evaporator to afford 7.9 g of compound (5-b).

In 50 ml of tetrahydrofuran (produced by Wako Pure Chemical Industries, Ltd.) was dissolved 7.9 g of the compound (5-b), and then was cooled to −80° C. After the addition of 22 ml of a 1.6 M n-butyl lithium solution in hexane (produced by Wako Pure Chemical Industries, Ltd.) followed by stirring for 2 hours, the temperature was increased to −50° C. and then 3.3 ml of dimethylformamide (produced by Wako Pure Chemical Industries, Ltd.) was added. The temperature was increased to room temperature and then stirring was conducted under a nitrogen atmosphere for 5 hours. To the resulting solution were added 100 ml of ethyl acetate and 100 ml of a saturated aqueous ammonium chloride solution. Then, the organic layer was separated, washed with 100 ml of water repeatedly three times, and then dried over magnesium sulfate. The solvent was removed from the resulting solution by evap-oration under reduced pressure with a rotary evaporator to afford 6.3 g of compound (5-c).

In 100 ml of tetrahydrofuran (product made from Wako Pure Chemical Industries, Ltd.) were dissolved 6.3 g of the compound (5-c) and 3.8 g of compound (5-d) (produced by Tokyo Chemical Industry Co., Ltd.). A suspension in which 6.0 g of potassium tert-butoxide (produced by Tokyo Chemical Industry Co., Ltd.) was suspended in 100 ml of tetrahydrofuran (produced by Wako Pure Chemical Industries, Ltd.) was dropped and stirred under a nitrogen atmosphere at 70° C. for 9 hours. To the resulting solution were added 100 ml of dichloromethane and 100 ml of saturation brine, followed by separation of the organic layer. The organic layer was washed with 100 ml of water repeatedly three times, and then dried over magnesium sulfate. The resulting solution was purified by column chromatography (fil-ler: silica gel, eluent: dichloromethane/hexane) to yield 2 g of compound (5-e).

In 30 ml of tetrahydrofuran (produced by Wako Pure Chemical Industries, Ltd.) was dissolved 2 g of the compound (5-e), and then was cooled to −80° C. After the addition of 22 ml of a 1.6 M n-butyl lithium solution in hexane (produced by Wako Pure Chemical In-dustries, Ltd.) followed by stirring for 4 hours, the temperature was increased to −50° C. and then 1.7 g of 2-isopropoxy-4,4,5,5-tetramethyl-1,3,2-dioxaborolane (produced by Wako Pure Chemical Industries, Ltd.) was added. The temperature was increased to room temperature and then stirring was conducted under a nitrogen atmosphere for 12 hours. To the resulting solution were added 200 ml of dichloromethane and 100 ml of water, followed by separation of the organic layer. The organic layer was washed with 100 ml of water repeatedly three times, and then dried over magnesium sulfate. The resulting solution was purified by column chromatography (filler: silica gel, eluent: dichloromethane/hexane) to yield 1.3 g of com-pound (5-f).

In 40 ml of tetrahydrofuran (produced by Wako Pure Chemical Industries, Ltd.) was dissolved 3 g of compound (5-a) (produced by Tokyo Chemical Industry Co., Ltd.), and then cooled to −80° C. After the addition of 12 ml of a 1.6 M n-butyl lithium solution in hex-ane (produced by Wako Pure Chemical Industries, Ltd.) followed by stirring for 2 hours, the temperature was increased to −60° C. and then 5.5 g of 2-isopropoxy-4,4,5,5-tetramethyl-1,3,2-dioxaborolane (produced by Wako Pure Chemical Industries, Ltd.) was added. The temper-ature was increased to room temperature and then stirring was conducted under a nitrogen atmosphere for 4 hours. To the resulting solution were added 100 ml of dichloromethane and 100 ml of saturation brine, followed by separation of the organic layer. The organic layer was washed with 100 ml of water repeatedly three times, and then dried over magnesium sulfate. The solvent was removed from the resulting solution by evaporation under reduced pressure with a rotary evaporator to afford 4.6 g of compound (5-g).

In 100 ml of toluene were dissolved 4.6 g of the compound (5-g) and 2.1 g of the compound (1-b) in Synthesis Example 1. To this solution were added 30 ml of ethanol, 30 ml of a 2M aqueous sodiun carbonate solution and 0.15 g of tetrakis (triphenylphosphine) palladium(0) (produced by Tokyo Chemical Industry Co., Ltd.), followed by stirring under a nitrogen atmosphere at 110° C. for 13 hours. To the resulting solution were added 100 ml of ethyl acetate and 100 ml of water, followed by separation of the organic layer. The solvent was removed from the resulting solution by evaporation under reduced pressure with a rotary evaporator to afford 5.8 g of compound (5-h).

In 3 ml of dimethylformamide (produced by Wako Pure Chemical Industries, Ltd.) was dissolved 5.8 g of the com-pound (5-h), and then 3.5 g of N-bromosuccinimide (produced by Wako Pure Chemical Industries, Ltd.) was added and followed by stirring under a nitrogen atmosphere at room temperature for 2 hours. To the resulting solution were added 100 ml of water and 100 ml of ethyl acetate, followed by separation of the organic layer. The organic layer was washed with 100 ml of water repeatedly three times, and then dried over magnesium sulfate. The resulting solution was purified by column chromatography (filler: silica gel, eluent: dichloromethane/hexane) to yield 1.6 g of compound (5-i).

In 20 ml of toluene were dissolved 0.25 g of the compound (5-f) and 0.11 g of the compound (5-i). To this solution were added 10 ml of ethanol, 15 ml of a 2M aqueous sodium carbonate solution and 11 mg of tetrakis(triphenylphosphine)palladium(0) (produced by Tokyo Chemical Industry Co., Ltd.), followed by stirring under a nitrogen atmosphere at 110° C. for 12 hours. To the resulting solution were added 100 ml of ethyl acetate and 100 ml of water, followed by separation of the organic layer. The resulting solution was purified by column chromatography (filler: silica gel, eluent: dichloromethane/hexane) to yield 0.17 g of compound A-5. The $^1$H-NMR measurement of compound A-5 is shown:

$^1$H-NMR (CDCl$_2$, ppm): 7.93 (s, 2H), 7.75 (s, 2H), 7.44 (m, 8H), 7.28 (d, 2H), 7.22 (d, 2H), 7.10 (d, 2H), 7.00 (m, 2H), 6.83 (m, 6H) 2.86 (m, 4H) 2.69 (m, 8H) 1.73 (m, 4H), 1.63 (m, 8H), 1.34 (m, 36H), 0.93 (m, 18H).

Synthesis Example 6

Compound A-6 was synthesized by the method illustrated in Scheme 6.

Synthesis Example 7

Compound A-7 was synthesized by the method illustrated in Scheme 7.

Formula 7

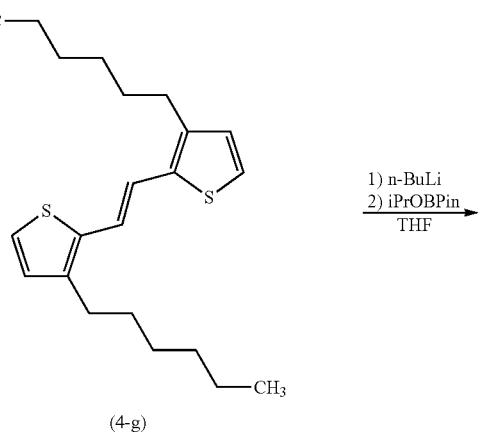

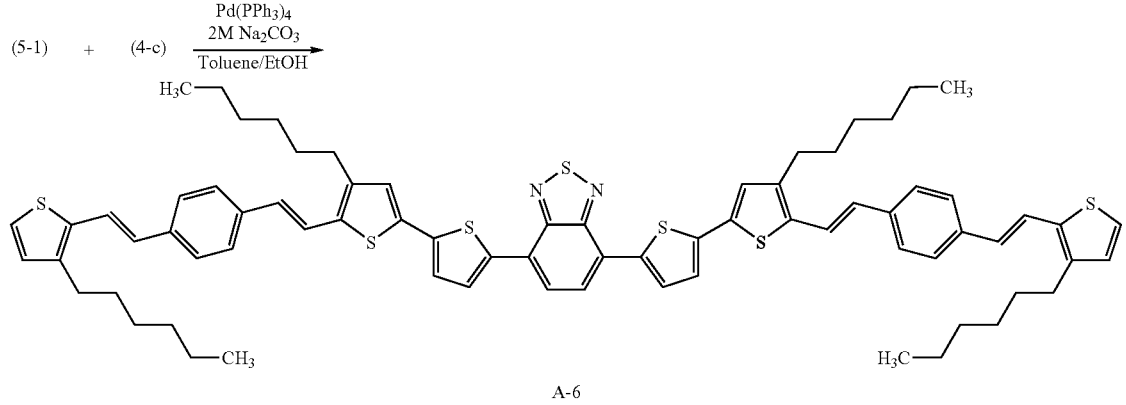

In 60 ml of toluene were dissolved 1 g of the compound (5-f) in Synthesis Exam-ple 5 and 0.31 g of the compound (4-c) in Synthesis Example 4. To this solution were added 15 ml of ethanol, 10 ml of a 2M aqueous sodium carbonate solution and 30 mg of tetrakis(triphenylphosphine) palladium (0) (produced by Tokyo Chemical Industry Co., Ltd.), followed by stirring under a nitrogen atmosphere at 110° C. for 21 hours. To the resulting solution were added 100 ml of ethyl acetate and 100 ml of water, followed by separation of the organic layer. The resulting solution was purified by column chromatography (filler: sil-ica gel, eluent: dichloromethane/hexane) to yield 0.36 g of compound A-6. The $^1$H-NMR measurement of compound A-6 is shown:

$^1$H-NMR (CDCl$_2$, ppm): 7.95 (s, 2H), 7.76 (s, 2H), 7.42 (m, 8H), 7.25 (m, 4H), 7.18 (d, 2H), 7.10 (d, 2H), 7.02 (m, 2H), 6.84 (m, 6H), 2.65 (m, 8H), 1.61 (m, 8H), 1.33 (m, 24H), 0.92 (m, 12H).

-continued

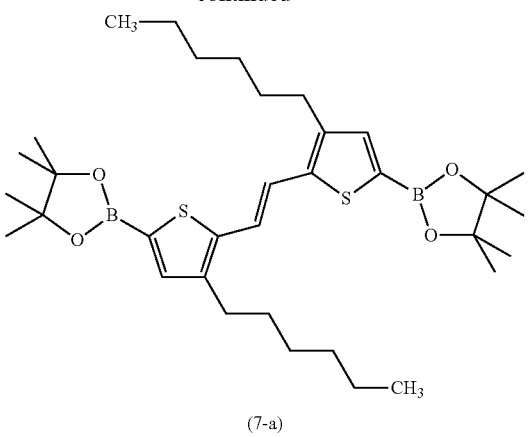

-continued

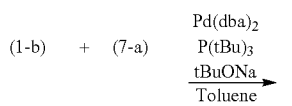

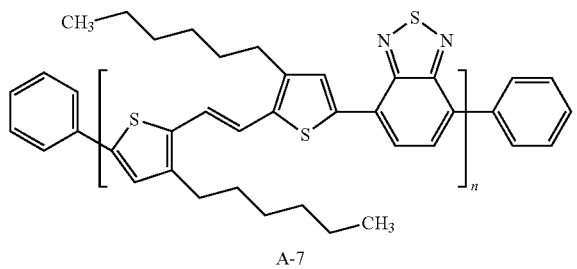

A-7

In 30 ml of tetrahydrofuran (produced by Wako Pure Chemical Industries, Ltd.) was dissolved 2 g of the compound (4-g) in Synthesis Example 4, and then was cooled to −20° C. After the addition of 6.9 ml of a 1.6 M n-butyl lithium solution in hexane (produced by Wako Pure Chemical Industries, Ltd.), the temperature was increased to room temperature and then stirring was continued under a nitrogen atmosphere for 4 hours. After cooling to −20° C. again, ml of 2-isopropoxy-4,4,5,5-tetramethyl-1,3,2-dioxaborolane (produced by Wako Pure Chemical Industries, Ltd.) was added. The temperature was increased to room temperature and then stirring was conducted under a nitrogen atmosphere for 12 hours. To the resulting solution were added 100 ml of water and 100 ml of dichloromethane. Then, the organic layer was separated, washed with 100 ml of water, and then dried over magnesium sulfate. The resulting solution was purified by column chromatography (filler: silica gel, eluent: dichloromethane/hexane) to yield 0.355 g of compound (7-a).

In 20 ml of toluene were dissolved 0.17 g of the compound (1-b) in Synthesis Example 1 and 0.355 g of compound (7-a). To this solution were added 7 mg of bis(dibenzylideneacetone) palladium (produced by Aldrich Chemical Company, Inc.), 6 mg of tri(tertbutyl)phosphine (produced by Aldrich Chemical Company, Inc.), and 0.22 g of sodium tertbutoxide (produced by Wako Pure Chemical Industries, Ltd.), followed by stirring under a nitrogen atmosphere at 100° C. for 20 hours. Then, 0.16 g of bromobenzene (produced by Tokyo Chemical Industry Co., Ltd.) and 0.2 g of phenylboronic acid (produced by Tokyo Chemical Industry Co., Ltd.) were added and subsequently stirred at 100° C. for 5 hours. The solvent was distilled off from the resulting suspension under reduced pressure by using a rotary evaporator and was followed by successive washing with hot methanol and hot hexane. The resulting solid was dissolved in chloroform and purified by column chromatography (filler: Florisil, eluent: chloroform) to afford 50 mg of compound A-7. The weight average molecular weight was 2900 and the number average molecular weight was 2200. The polymerization degree n was 4.5.

Synthesis Example 8

Compound A-8 was synthesized by the method illustrated in Scheme 8.

Formula 8

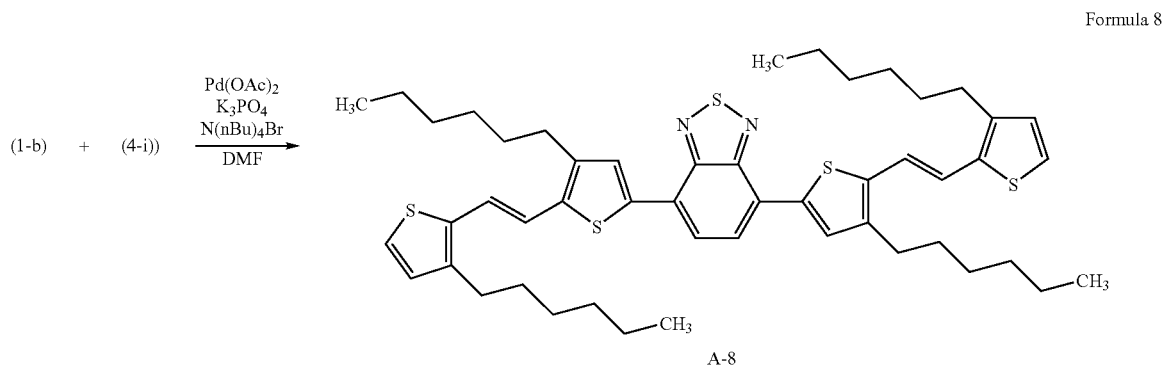

A-8

To 50 ml of dimethylformamide (produced by Kishida Chemical Co., Ltd.) were added 0.65 g of the compound (1-b) in Synthesis Example 1 and 2.15 g of the compound (4-i) in Synthesis Example 4. Then, under a nitrogen atmosphere, 1.87 g of potassium phosphate produced by Wako Pure Chemical Industries, Ltd.), 0.28 g of tetrabutylammonium bromide (produced by Wako Pure Chemical Industries, Ltd.), and 20 mg of palladium acetate (pro-duced by Wako Pure Chemical Industries, Ltd.) were added and followed by stirring at 120° C. for 4 hours. To the resulting solution were added 100 ml of water and 400 ml of dichloromethane. Then, the organic layer was separated, washed with 100 ml of water, and then dried over magnesium sulfate. The resulting solution was purified by column chromatography (filler: silica gel, eluent: dichloromethane/hexane) to yield 1.19 g of compound A-8. The $^1$H-NMR measurement of compound A-8 is shown:

$^1$H-NMR (CDCl$_2$, ppm): 7.96 (s, 2H), 7.83 (s, 2H), 7.10 (m, 6H), 6.87 (d, 2H), 2.73 (m, 8H), 1.65 (m, 8H), 1.36 (m, 24H), 0.91 (t, 12H).

Synthesis Example 9

Compound A-9 was synthesized by the method illustrated in Scheme 9.

Formula 9

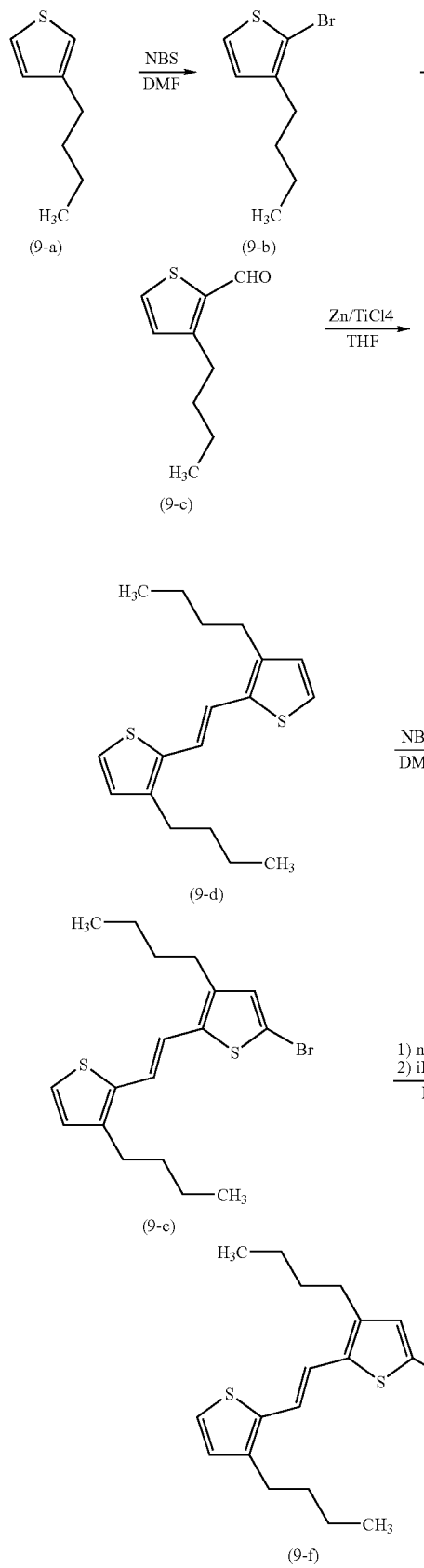

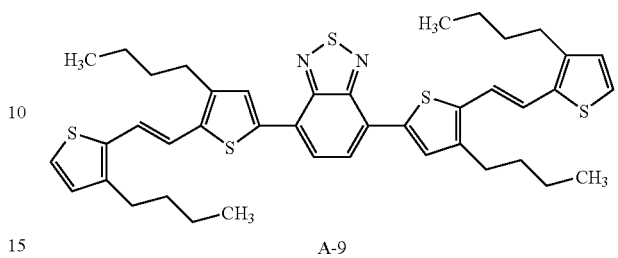

Compound (9-f) was synthesized in the same manner as that for compound (1-h) except for using compound (9-a) instead of compound (1-c). To 50 ml of dimethylform-amide (produced by Kishida Chemical Co., Ltd.) were added 0.92 g of the compound (1-b) in Synthesis Example 1 and 3.16 g of the compound (9-f). Then, under a nitrogen atmosphere, 2.63 g of potassium phosphate (produced by Wako Pure Chemical Industries, Ltd.), 0.40 g of tetrabutylammonium bromide (produced by Wako Pure Chemical Industries, Ltd.), and 28 mg of palladium acetate (produced by Wako Pure Chemical Industries, Ltd.) were added and followed by stirring at 120° C. for 3 hours. To the resulting solution were added 300 ml of water and 150 ml of dichloromethane. Then, the organic layer was separated, washed with 100 ml of water, and then dried over magnesium sulfate. The resulting solution was purified by column chromatography (filler: silica gel, eluent: dichloromethane/hexane) to yield 0.88 g of compound A-9. The $^1$H-NMR measurement of compound A-9 is shown:

$^1$H-NMR (CDCl$_2$, ppm): 7.97 (s, 2H), 7.83 (s, 2H), 7.09 (m, 6H), 6.87 (d, 2H), 2.74 (m, 8H), 1.66 (m, 8H), 1.44 (m, 8H), 0.98 (m, 12H).

Synthesis Example 10

Compound A-10 was synthesized by the method illustrated in Scheme 10.

Formula 10

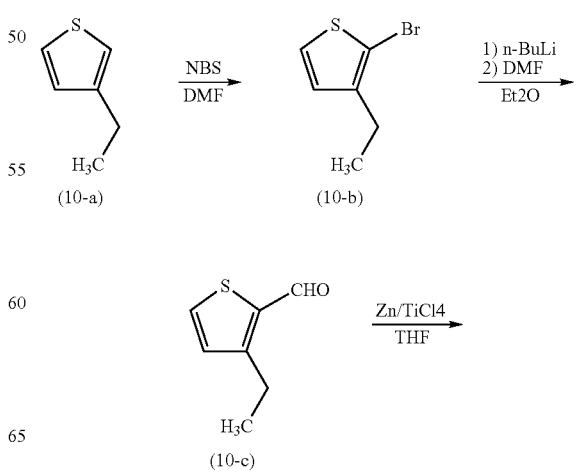

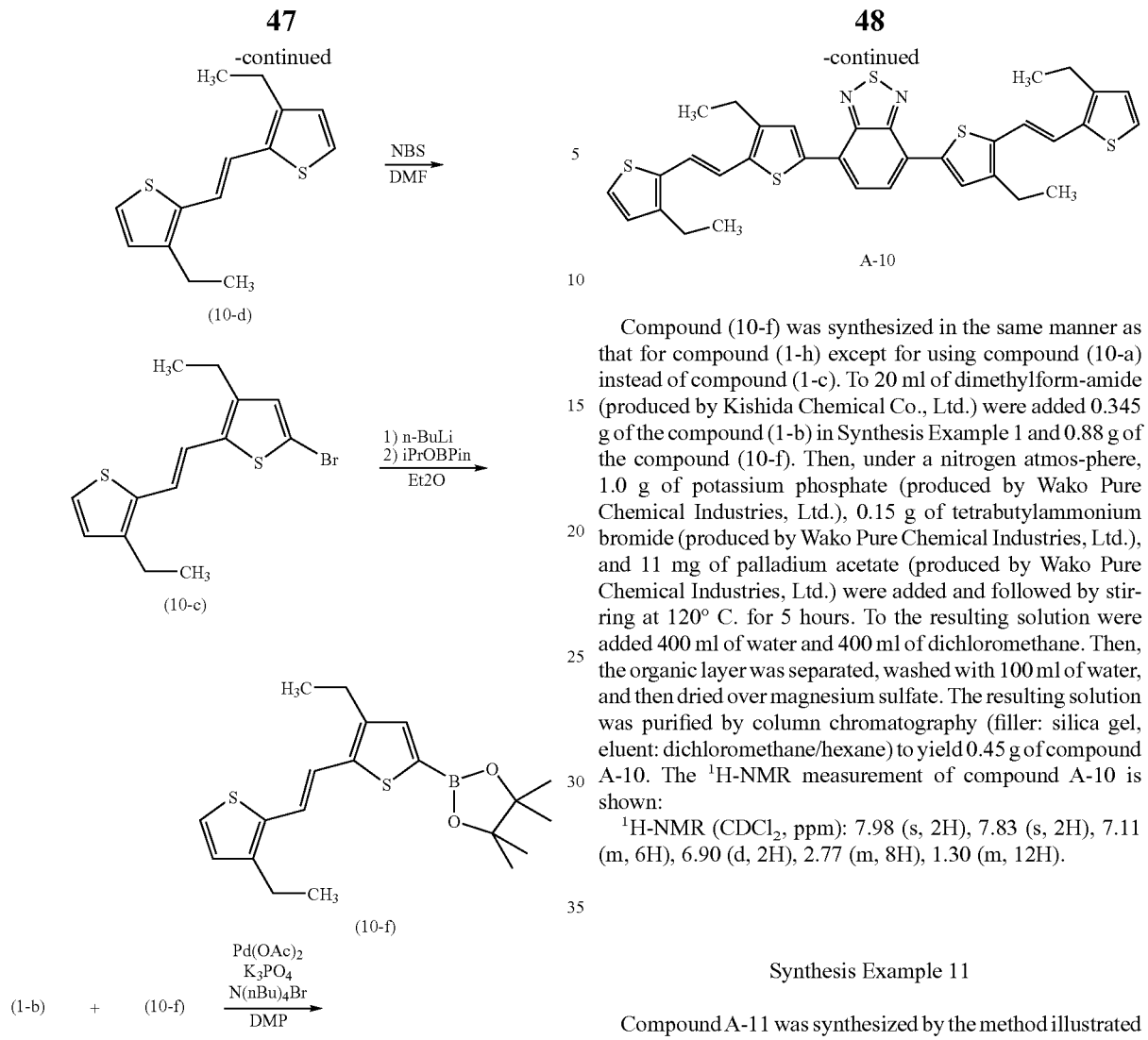

Compound (10-f) was synthesized in the same manner as that for compound (1-h) except for using compound (10-a) instead of compound (1-c). To 20 ml of dimethylform-amide (produced by Kishida Chemical Co., Ltd.) were added 0.345 g of the compound (1-b) in Synthesis Example 1 and 0.88 g of the compound (10-f). Then, under a nitrogen atmos-phere, 1.0 g of potassium phosphate (produced by Wako Pure Chemical Industries, Ltd.), 0.15 g of tetrabutylammonium bromide (produced by Wako Pure Chemical Industries, Ltd.), and 11 mg of palladium acetate (produced by Wako Pure Chemical Industries, Ltd.) were added and followed by stirring at 120° C. for 5 hours. To the resulting solution were added 400 ml of water and 400 ml of dichloromethane. Then, the organic layer was separated, washed with 100 ml of water, and then dried over magnesium sulfate. The resulting solution was purified by column chromatography (filler: silica gel, eluent: dichloromethane/hexane) to yield 0.45 g of compound A-10. The $^1$H-NMR measurement of compound A-10 is shown:

$^1$H-NMR (CDCl$_2$, ppm): 7.98 (s, 2H), 7.83 (s, 2H), 7.11 (m, 6H), 6.90 (d, 2H), 2.77 (m, 8H), 1.30 (m, 12H).

Synthesis Example 11

Compound A-11 was synthesized by the method illustrated in Scheme 11.

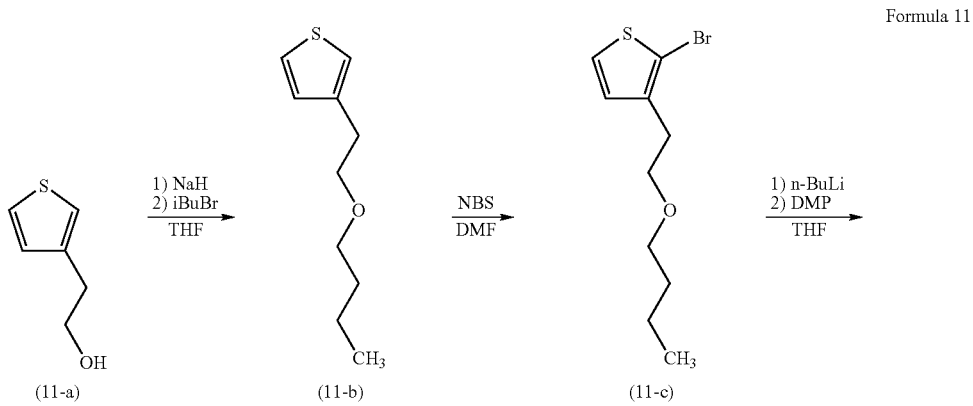

-continued
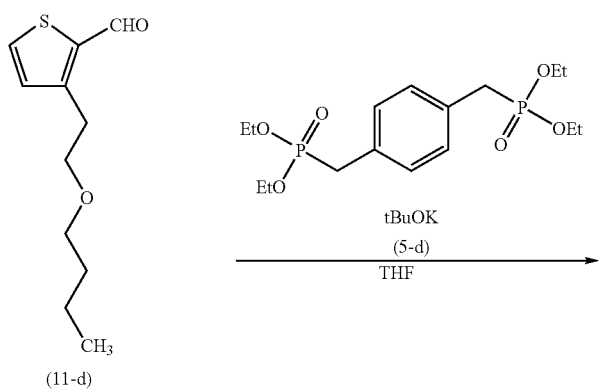
(11-d)
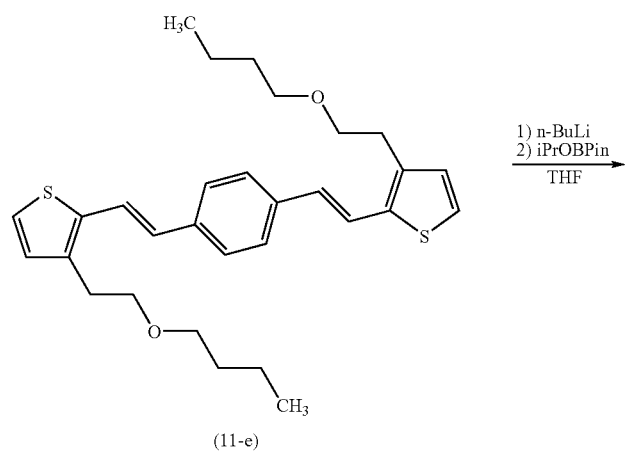
(11-e)
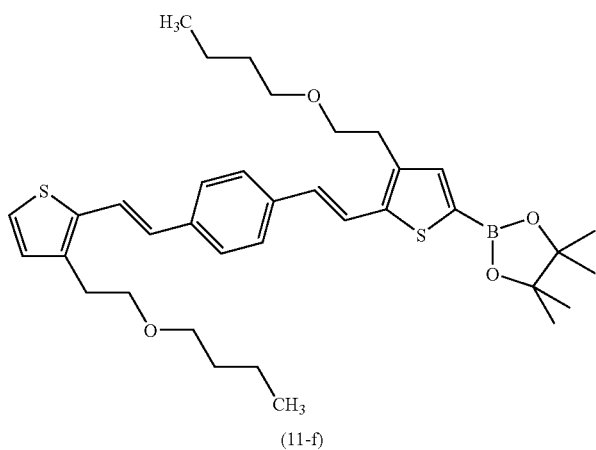
(11-f)
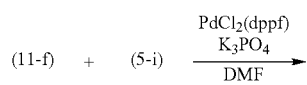

-continued

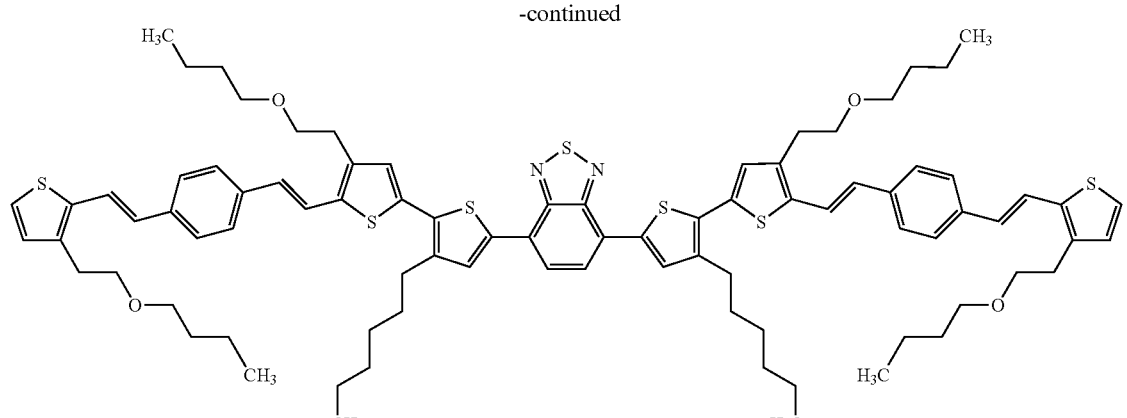

A-11

In 100 ml of tetrahydrofuran (produced by Wako Pure Chemical Industries, Ltd.) was dissolved 4.1 g of sodium hydride (produced by Wako Pure Chemical Industries, Ltd.). Then, 8 g of compound (11-a) (produced by Tokyo Chemical Industry Co., Ltd.) was added and stirred under a nitrogen atmosphere at 0° C. for 1 hour. Subsequently, 12.8 g of butyl bro-mide (produced by Wako Pure Chemical Industries, Ltd.) was added, and stirred at 70° C. for 5 hours. To the resulting solution were added 200 ml of 1 N hydrochloric acid and 200 ml of ethyl acetate. Then, the organic layer was separated, washed with 100 ml of water repeatedly three times, and then dried over magnesium sulfate. The resulting solution was purified by column chromatography (filler: silica gel, eluent: ethyl acetate/hexane) to yield 7.22 g of compound (11-b).

Compound (11-f) was synthesized in the same manner as that for compound (5-f) except for using compound (11-b) instead of compound (5-a). To 10 ml of dimethylform-amide (produced by Kishida Chemical Co., Ltd.) were added 0.13 g of the compound (5-i) in Synthesis Example 5 and 0.43 g of the compound (11-f). Under a nitrogen atmosphere, 0.27 g of potassium phosphate (produced by Wako Pure Chemical Industries, Ltd.) and 17 mg of [bis(diphenylphosphino)ferrocene]dichloropalladium (produced by Aldrich Chemical Company, Inc.) were added and stirred at 100° C. for 5 hours.

To the resulting solution were added 100 ml of water and 100 ml of dichloromethane. Then, the organic layer was separated, washed with 50 ml of water, and then dried over magnesium sulfate. The resulting solution was purified by column chromatography (filler: silica gel, eluent: dichloromethane/hexane) to yield 57 mg of compound A-11. The $^1$H-NMR measurement of compound A-11 is shown:

$^1$H-NMR (CDCl$_2$, ppm): 7.99 (s, 2H), 7.84 (s, 2H), 7.47 (m, 8H), 7.29 (m, 6H), 7.11 (m, 4H), 6.89 (m, 4H), 3.65 (m, 12H), 3.48 (m, 12H), 3.02-2.91 (m, 12H), 1.84-1.32 (m, 24H), 0.92 (m, 18H).

Synthesis Example 12

Compound A-12 was synthesized by the method illustrated in Scheme 12.

Formula 12

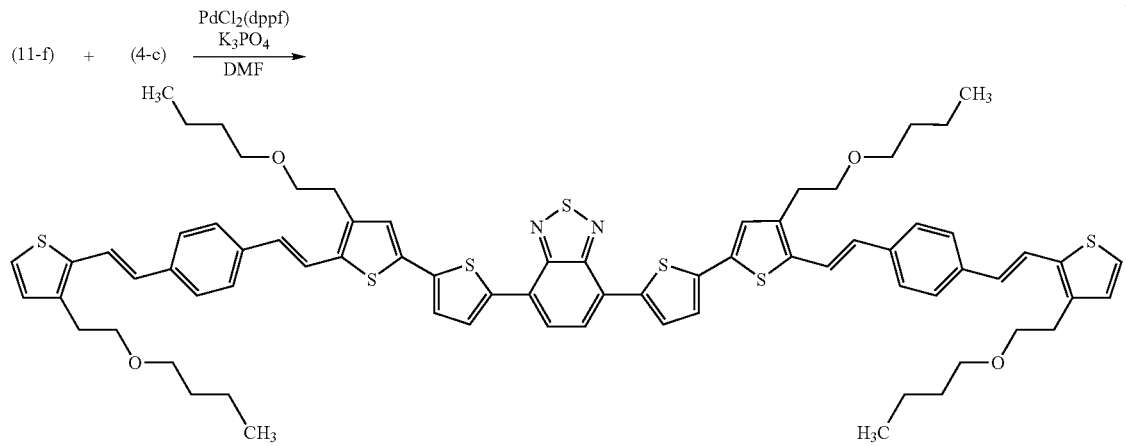

A-12

To 7 ml of dimethylformamide (produced by Kishida Chemical Co., Ltd.) were added 0.296 g of the compound (11-f) in Synthesis Example 11 and 65 mg of the compound (4-c) in Synthesis Example 4. Under a nitrogen atmosphere, 0.18 g of potassium phosphate (produced by Wako Pure Chemical Industries, Ltd.) and 11 mg of [bis(diphenylphosphino)ferrocene]dichloropalladium (produced by Aldrich Chemical Company, Inc.) were added and stirred at 100° C.

for 9 hours. To the resulting solution were added 100 ml of water and 100 ml of dichloromethane. Then, the organic layer was separated, washed with 50 ml of water, and then dried over magnesium sulfate. The resulting solution was purified by column chromatography (filler: silica gel, eluent: dichloromethane/hexane) to yield 5 mg of com-pound A-12. The $^1$H-NMR measurement of compound A-12 is shown:

$^1$H-NMR (CDCl$_2$, ppm): 8.06 (d, 2H), 7.87 (s, 2H), 7.46 (m, 8H), 7.28 (m, 6H), 7.12 (m, 4H), 6.89 (m, 6H), 3.64 (m, 8H), 3.47 (m, 8H), 3.00 (m, 8H), 1.62-1.25 (m, 16H), 0.91 (m, 12H).

Synthesis Example 13

Compound A-13 was synthesized by the method illustrated in Scheme 13.

Formula 13

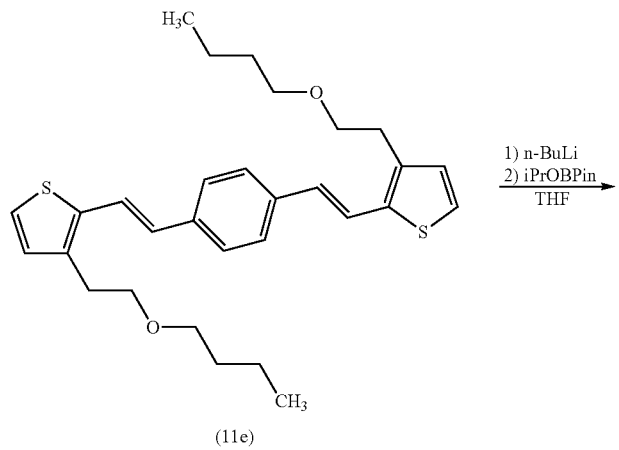

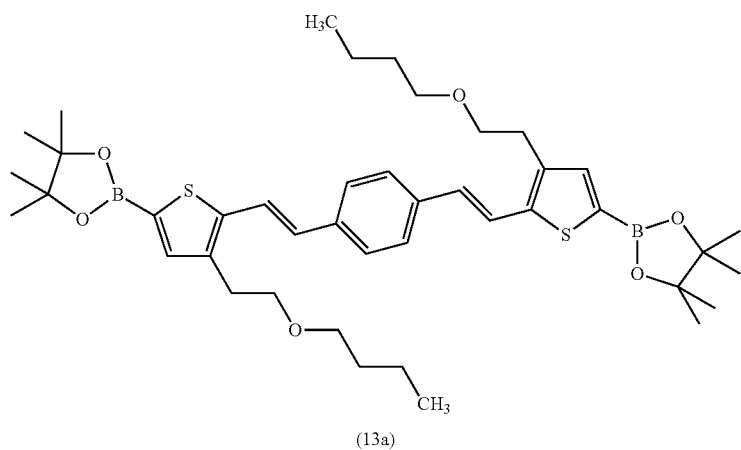

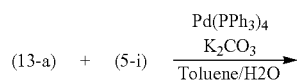

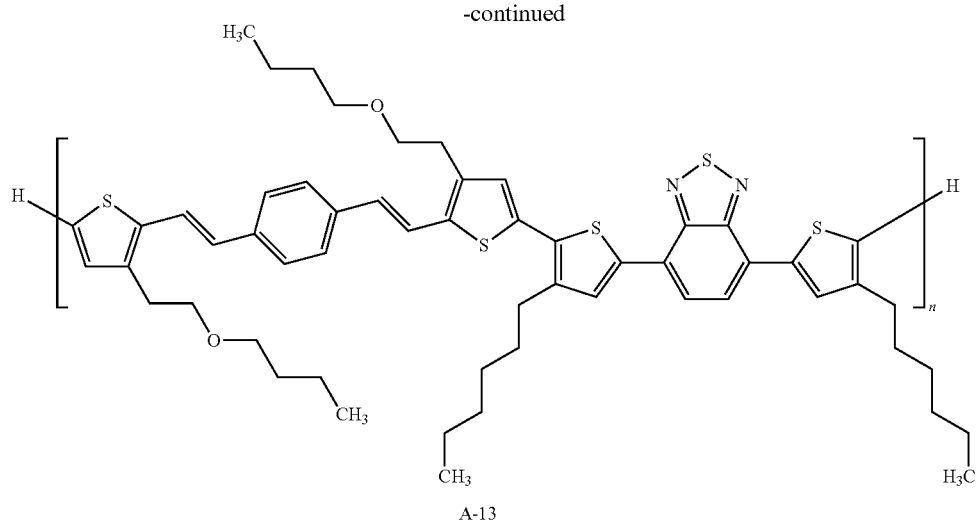

A-13

Compound (13-a) was synthesized in the same manner as that for compound (7-a) except for using compound (11-e) instead of compound (4-g). In 10 ml of toluene were dissolved 0.3 g of the compound (5-i) in Synthesis Example 5 and 0.358 g of the compound (13-a). To this solution were added 4 ml of water, 1.32 g of potassium carbonate and 28 mg of tetrakis(triphenylphosphine) palladium(0) (produced by Tokyo Chemical Industry Co., Ltd.), followed by stirring under a nitrogen atmosphere at 100° C. for 48 hours. The resulting solu-tion was poured into methanol/36% hydrochloric acid (500 ml/20 ml), and a resulting solid was collected by filtration. The obtained solid was dissolved in 400 ml of chloroform, washed with 1 N hydrochloric acid, and then dried over magnesium sulfate. The resulting solution was concentrated to 10 ml and then was dropped into 400 ml of methanol to repre-cipitate. The resulting solid was collected by filtration to afford 0.21 g of compound A-13. The weight average molecular weight was 12100 and the number average molecular weight was 6190. The polymerization degree n was 12.6.

For each of the compounds A-1 to A-13 obtained by the methods described above, the relationship with formula (1) is shown in Table 1.

TABLE 1

| Compound | n | m | x | w | y | z | The number of alkyl groups in $R^1$-$R^{12}$ |
|---|---|---|---|---|---|---|---|
| | | | Relationship with formula (1) | | | | |
| A-1 | 1 | 1 | Heteroarylene group | Single bond | Single bond | Heteroarylene group | 4 |
| A-2 | 7.9 | 1 | Heteroarylene group | Single bond | Single bond | Heteroarylene group | 4 |
| A-3 | 1 | 1 | Heteroarylene group | Single bond | Single bond | Heteroarylene group | 2 |
| A-4 | 1 | 1 | Heteroarylene group | Heteroarylene group | Heteroarylene group | Heteroarylene group | 4 |
| A-5 | 1 | 1 | Heteroarylene group Ethenylene group Arylene group | Heteroarylene group | Heteroarylene group | Heteroarylene group Ethenylene group Arylene group | 6 |
| A-6 | 1 | 1 | Heteroarylene group Ethenylene group Arylene group | Heteroarylene group | Heteroarylene group | Heteroarylene group Ethenylene group Arylene group | 4 |
| A-7 | 4.5 | 0 | Heteroarylene group | Single bond | None | None | 2 |
| A-8 | 1 | 1 | Heteroarylene group | Single bond | Single bond | Heteroarylene group | 4 |
| A-9 | 1 | 1 | Heteroarylene group | Single bond | Single bond | Heteroarylene group | 4 |
| A-10 | 1 | 1 | Heteroarylene group | Single bond | Single bond | Heteroarylene group | 4 |
| A-11 | 1 | 1 | Heteroarylene group Ethenylene | Heteroarylene group | Heteroarylene group | Heteroarylene group Ethenylene | 6 |

TABLE 1-continued

Relationship with formula (1)

| Compound | n | m | x | w | y | z | The number of alkyl groups in $R^1$-$R^{12}$ |
|---|---|---|---|---|---|---|---|
| A-12 | 1 | 1 | group Arylene group Heteroarylene group Ethenylene group Arylene group | Heteroarylene group | Heteroarylene group | group Arylene group Heteroarylene group Ethenylene group Arylene group | 4 |
| A-13 | 12.6 | 0 | Heteroarylene group Ethenylene group Arylene group | Heteroarylene group | None | None | 4 |

Example 1

A sample tube containing 1 ml of chloroform was added 5 mg of the A-1 and was irradiated with ultrasonic waves for 30 minutes in an ultrasonic washing machine (US-2 (commercial name) manufactured by Iuchi Seieido Co., Ltd., output 120 W) to give solution A.

A glass substrate on which an ITO transparent conductive layer, which would serve as a positive electrode, had been deposited in a thickness of 120 nm by sputtering was cut into a size of 38 mm×46 mm. Then, the ITO was patterned into a rectangular shape of 38 mm×13 mm in size by photolithography. The resulting substrate was ultrasonically washed for 10 minutes with an alkaline cleaning solution ("Semico Clean" EL56 (commercial name) produced by Furuuchi Chemical Corporation) and then washed with pure water. The substrate was subjected to UV/ozone treatment for 30 minutes and then an aqueous PEDOT:PSS solution (containing 0.8% by weight of PEDOT and 0.5% by weight of PPS) was coated by spin coating on the substrate to form a film in a thickness of 100 nm which would serve as a hole transport layer. After drying by heating at 200° C. for 5 minutes by means of a hot plate, the solution A was dropped onto the PEDOT:PSS layer and a p-type semiconductor layer of 50 nm in thickness was formed by spin coating. Then, the substrate on which the p-type semiconductor layer had been formed was placed in a vacuum deposition equipment. The gas in the equipment was exhausted to a degree of vacuum of $1\times10^{-3}$ Pa or less, and then fullerene $C_{60}$ was vapor-deposited in a thickness of 50 nm by resistive heating. A mask for a cathode was installed in the vacuum deposition equipment. The gas in the equipment was exhausted to a degree of vacuum of $1\times10^{-3}$ or less again, and then an aluminum layer of 80 nm in thickness, which would serve as a negative electrode, was vapor-deposited by resistive heating. Extractor electrodes were picked out from the upper and lower electrodes, and a photoelectric conversion device was prepared in which each part where a striped ITO layer crossed with a striped aluminum layer had an area of 5 mm×5 mm.

The thus prepared photovoltaic device was placed in a shield box and the upper and the lower electrodes were connected to a picoammeter/voltage source 4140B manufactured by Hewlett-Packard. While a metal halide lamp white light (100 mW/cm²) was applied from the ITO layer side under reduced pressure (100 Pa), the electric current value was measured when the applied voltage was changed from −2 V to +2 V. At this time, the short-circuit current density (i.e., the value of a current density at an applied voltage of 0 V) was 5.74 mA/cm². The open-circuit voltage (i.e., the value of a voltage applied when the current density became 0) was 0.75 V and the fill factor (FF) was 0.33. The photoelectric conversion efficiency calculated from those values was 1.4%. The fill factor and the photoelectric conversion efficiency were calculated by the following formulae:

Fill factor=JVmax/(Short-circuit current density×
   Open-circuit voltage)

(The JVmax is the value of the product of the current density and the applied voltage in the point where the product of the current density and the applied voltage becomes maximum in the applied voltage range between 0 V and the open-circuit voltage value.)

Photoelectric conversion efficiency=[(Short-circuit
   current density×Open-circuit voltage×Fill factor)/White light intensity]×100

The fill factors and the photoelectric conversion efficiencies in the following Examples and Comparative Examples were all calculated by the above formulae.

Example 2

A photoelectric conversion device was prepared in the same manner as that in Example 1 except for using the A-2 instead of A-1, and the current/voltage characteristics were measured. At this time, the short-circuit current density was 5.21 mA/cm². The open-circuit voltage was 0.72 V and the fill factor (FF) was 0.35. The photoelectric conversion efficiency calculated from those values was 1.31%.

Comparative Example 1

A photoelectric conversion device was prepared in the same manner as that in Example 1 except for using P3HT (produced by Aldrich Chemical Company, Inc.), being a p-type organic semiconductor, instead of A-1, and the current/voltage characteristics were measured. At this time, the short-circuit current density was 2.31 mA/cm². The open-circuit voltage was 0.19 V and the fill factor (FF) was 0.21. The photoelectric conversion efficiency calculated from those values was 0.09%.

Comparative Example 2

A photoelectric conversion device was prepared in the same manner as that in Example 1 except for using the following B-1, being a p-type organic semiconductor, instead of A-1, and the current/voltage characteristics were measured. At this time, the short-circuit current density was 2.25 mA/cm². The open-circuit voltage was 0.45 V and the fill factor (FF) was 0.30. The photoelectric conversion efficiency calculated from those values was 0.3%.

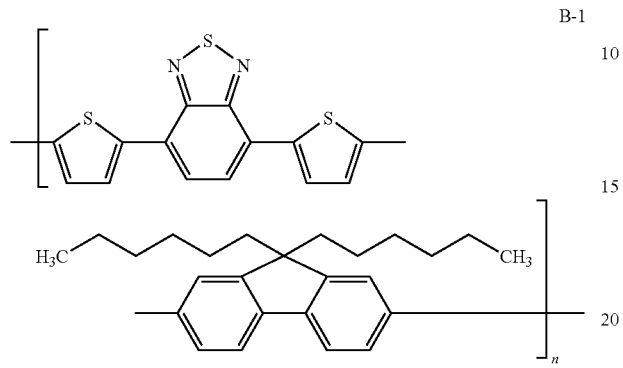

B-1

Example 3

A sample tube containing 1 ml of chloroform was added 5 mg of the A-1 and 5 mg of PCBM (produced by American Dye Source, Inc.) and was irradiated with ultrasonic waves for 30 minutes in an ultrasonic washing machine (US-2 (commercial name) manufactured by Iuchi Seieido Co., Ltd., output 120 W) to give solution B.

In the same manner as that in Example 1 except for changing the solution A used in Example 1 to the solution B, the solution B was dropped onto the PEDOT:PSS layer and an organic semiconductor layer of 100 nm in thickness was formed by spin coating. Then, the substrate on which the organic semiconductor layer had been formed and a mask for a cathode were installed in the vacuum deposition equipment. The gas in the equipment was exhausted to a degree of vacuum of 1×10⁻³ or less again, and then an aluminum layer of 80 nm in thickness, which would serve as a negative electrode, was vapor-deposited by resistive heating. Extractor electrodes were picked out from the upper and lower electrodes, and a photoelectric conversion device was prepared in which each part where a striped ITO layer crossed with a striped aluminum layer had an area of 5 mm×5 mm.

The current/voltage characteristics of the thus prepared photovoltaic device were measured in the same manner as that in Example 1. At this time, the short-circuit current density was 3.2 mA/cm². The open-circuit voltage was 0.85 V and the fill factor (FF) was 0.45. The photoelectric conversion efficiency calculated from those values was 1.2%.

Example 4

A photoelectric conversion device was prepared in the same manner as that in Example 3 except for using the A-2 instead of A-1, and the current/voltage characteristics were measured. At this time, the short-circuit current density was 3.1 mA/cm². The open-circuit voltage was 0.75 V and the fill factor (FF) was 0.45. The photoelectric conversion efficiency calculated from those values was 1%.

Comparative Example 3

A photoelectric conversion device was prepared in the same manner as that in Example 3 except for using the B-1 instead of A-1, and the current/voltage characteristics were measured. At this time, the short-circuit current density was 0.5 mA/cm². The open-circuit voltage was 0.75 V and the fill factor (FF) was 0.45. The photoelectric conversion efficiency calculated from those values was 0.17%.

Comparative Example 4

A photoelectric conversion device was prepared in the same manner as that in Example 3 except for using the following random copolymer B-2, being a p-type organic semiconductor, instead of A-1, and the current/voltage characteristics were measured. At this time, the short-circuit current density was 1.5 mA/cm². The open-circuit voltage was 0.55 V and the fill factor (FF) was 0.32. The photoelectric conversion efficiency calculated from those values was 0.26%.

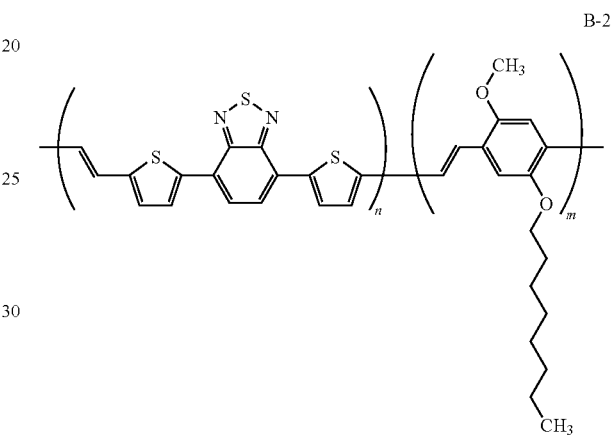

B-2

Comparative Example 5

A photoelectric conversion device was prepared in the same manner as that in Example 3 except for using the following B-3, being a p-type organic semiconductor, instead of A-1, and the current/voltage characteristics were measured. At this time, the short-circuit current density was 1.7 mA/cm². The open-circuit voltage was 0.52 V and the fill factor (FF) was 0.31. The photoelectric conversion efficiency calculated from those values was 0.27%.

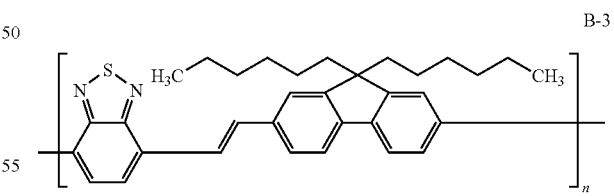

B-3

Examples 5 to 31

Photoelectric conversion devices having organic semiconductor layers of the materials given in Tables 2 and 3 were prepared in the same manner as that in Example 3. The short-circuit current density, the open-circuit voltage, the fill factor (FF), and the photoelectric conversion efficiency calculated from the foregoing values in each Example are shown in Tables 2 and 3.

TABLE 2

| | Organic semiconductor layer | | | | | |
|---|---|---|---|---|---|---|
| | Conjugated polymer of formula (1) (content) | Acceptor material (content) | Short-circuit current density (mA/cm$^2$) | Open-circuit voltage (V) | Fill factor | Photoelectric conversion efficiency (%) |
| Example 1 | A-1 | C$_{60}$ | 5.74 | 0.75 | 0.33 | 1.4 |
| Example 2 | A-2 | C$_{60}$ | 5.21 | 0.72 | 0.35 | 1.31 |
| Comparative Example 1 | None | C$_{60}$ | 2.31 | 0.19 | 0.21 | 0.09 |
| Comparative Example 2 | None | C$_{60}$ | 2.25 | 0.45 | 0.3 | 0.3 |
| Example 3 | A-1 (5 mg) | PCBM (5 mg) | 3.2 | 0.85 | 0.45 | 1.2 |
| Example 4 | A-2 (5 mg) | PCBM (5 mg) | 3.1 | 0.75 | 0.45 | 1 |
| Comparative Example 3 | None | PCBM (5 mg) | 0.5 | 0.75 | 0.45 | 0.17 |
| Comparative Example 4 | None | PCBM (5 mg) | 1.5 | 0.55 | 0.32 | 0.26 |
| Comparative Example 5 | None | PCBM (5 mg) | 1.7 | 0.52 | 0.31 | 0.27 |
| Example 5 | A-1 (5 mg) | PC$_{70}$BM (5 mg) | 5.19 | 0.89 | 0.26 | 1.2 |
| Example 6 | A-1 (3.3 mg) | PC$_{70}$BM (6.7 mg) | 5.97 | 0.9 | 0.26 | 1.41 |
| Example 7 | A-1 (2.5 mg) | PC$_{70}$BM (7.5 mg) | 8.24 | 0.91 | 0.27 | 2.02 |
| Example 8 | A-1 (2 mg) | PC$_{70}$BM (8 mg) | 14.8 | 0.92 | 0.32 | 4.31 |
| Example 9 | A-3 (5 mg) | PCBM (5 mg) | 3.86 | 0.6 | 0.29 | 0.66 |
| Example 10 | A-3 (5 mg) | PC$_{70}$BM (5 mg) | 4.27 | 0.66 | 0.26 | 0.74 |
| Example 11 | A-3 (2.5 mg) | PC$_{70}$BM (7.5 mg) | 5.51 | 0.7 | 0.26 | 1.02 |
| Example 12 | A-4 (5 mg) | PC$_{70}$BM (5 mg) | 4.3 | 0.8 | 0.25 | 0.86 |
| Example 13 | A-4 (3.3 mg) | PC$_{70}$BM (6.7 mg) | 12.4 | 0.77 | 0.31 | 2.93 |
| Example 14 | A-4 (2.5 mg) | PC$_{70}$BM (7.5 mg) | 15.2 | 0.77 | 0.32 | 3.69 |

TABLE 3

| | Organic semiconductor layer | | | | | |
|---|---|---|---|---|---|---|
| | Conjugated polymer of formula (1) (content) | Acceptor material (content) | Short-circuit current density (mA/cm$^2$) | Open-circuit voltage (V) | Fill factor | Photoelectric conversion efficiency (%) |
| Example 15 | A-5 (5 mg) | PCBM (5 mg) | 3.08 | 0.77 | 0.25 | 0.59 |
| Example 16 | A-5 (5 mg) | PC$_{70}$BM (5 mg) | 5.2 | 0.77 | 0.25 | 1 |
| Example 17 | A-5 (3.3 mg) | PC$_{70}$BM (6.7 mg) | 11.3 | 0.84 | 0.28 | 2.69 |
| Example 18 | A-5 (2 mg) | PC$_{70}$BM (8 mg) | 11.8 | 0.85 | 0.3 | 3.02 |
| Example 19 | A-6 (5 mg) | PC$_{70}$BM (5 mg) | 7.53 | 0.63 | 0.33 | 1.59 |
| Example 20 | A-6 (3.3 mg) | PC$_{70}$BM (6.7 mg) | 8.12 | 0.63 | 0.38 | 1.93 |
| Example 21 | A-2 (2.5 mg) | PC$_{70}$BM (7.5 mg) | 6.84 | 0.59 | 0.37 | 1.49 |
| Example 22 | A-7 (5 mg) | PC$_{70}$BM (5 mg) | 3.9 | 0.77 | 0.25 | 0.74 |
| Example 23 | A-7 (3.3 mg) | PC$_{70}$BM (6.7 mg) | 5.2 | 0.68 | 0.29 | 1.02 |
| Example 24 | A-7 (2.5 mg) | PC$_{70}$BM (7.5 mg) | 6.7 | 0.68 | 0.29 | 1.32 |
| Example 25 | A-7 (2 mg) | PC$_{70}$BM (8 mg) | 8.56 | 0.67 | 0.28 | 1.63 |

TABLE 3-continued

| | Organic semiconductor layer | | | | | |
| --- | --- | --- | --- | --- | --- | --- |
| | Conjugated polymer of formula (1) (content) | Acceptor material (content) | Short-circuit current density (mA/cm$^2$) | Open-circuit voltage (V) | Fill factor | Photoelectric conversion efficiency (%) |
| Example 26 | A-8 (2 mg) | PC$_{70}$BM (8 mg) | 13.9 | 0.91 | 0.3 | 3.78 |
| Example 27 | A-9 (2 mg) | PC$_{70}$BM (8 mg) | 15.5 | 0.92 | 0.31 | 4.36 |
| Example 28 | A-10 (2 mg) | PC$_{70}$BM (8 mg) | 15.4 | 0.87 | 0.29 | 3.94 |
| Example 29 | A-11 (2 mg) | PC$_{70}$BM (8 mg) | 15.3 | 0.83 | 0.35 | 4.44 |
| Example 30 | A-12 (2 mg) | PC$_{70}$BM (8 mg) | 14.2 | 0.68 | 0.35 | 3.38 |
| Example 31 | A-13 (2 mg) | PC$_{70}$BM (8 mg) | 12.6 | 0.61 | 0.35 | 2.69 |

INDUSTRIAL APPLICABILITY

Photovoltaic devices using electron donating organic materials for photovoltaic devices can be applied to various types of photoelectric conversion devices using a photoelectrically converting function, an optically rectifying function, and the like. The devices are useful for, for example, photoelectric cells (such as solar cells), electronic devices (such as photosensors, optical switches, and phototransistor), and optical record material (such as optical memory).

The invention claimed is:

1. An electron donating organic material for photovoltaic devices which comprises a conjugated polymer represented by formula (1):

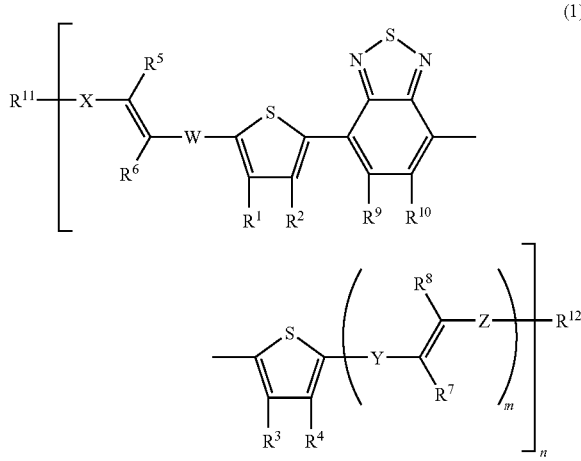

(1)

wherein $R^1$ to $R^{10}$ may be the same or different from each other and are each selected from the group consisting of hydrogen, an alkyl group, an alkoxy group and an aryl group; $R^{11}$ and $R^{12}$ may be the same or different from each other and are each selected from the group consisting of hydrogen, an alkyl group, an aryl group, a heteroaryl group and halogen; and W and Y may be the same or different from each other and are each selected from the group consisting of a single bond, an arylene group, a heteroarylene group, an ethenylene group, and an ethynylene group; X and Z may be the same or different from each other, wherein each may be selected from the group consisting of an arylene group, a heteroarylene group, and an ethenylene group and at least one of them is a heteroarylene group when n=1, wherein each may be selected from the group consisting of a single bond, an arylene group, a heteroarylene group, an ethenylene group, and an ethynylene group when n>1; m is 0 or 1; n is within a range of 1 to 1000.

2. The electron donating organic material of claim 1, wherein the conjugated polymer represented by formula (1) contains a conjugated polymer represented by formula (2):

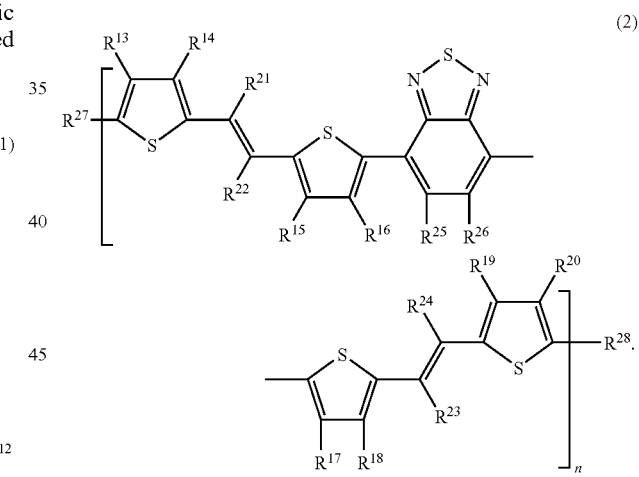

(2)

wherein $R^{13}$ to $R^{26}$ may be the same or different from each other and are each selected from the group consisting of hydrogen, an alkyl group, an alkoxy group and an aryl group; $R^{27}$ and $R^{28}$ may be the same or different from each other and are each hydrogen or an alkyl group; n is with-in a range of 1 to 1000.

3. The electron donating organic material of claim 2, wherein at least one of $R^1$ to $R^{12}$ in formula (1) is an alkyl group or at least one of $R^{13}$ to $R^{28}$ in formula (2) is an alkyl group.

4. A material for photovoltaic devices which contains an electron accepting organic material and the electron donating organic material of claim 2.

5. A material for photovoltaic devices which contains an electron accepting organic material and the electron donating organic material of claim 3.

6. The material of claim 4, wherein the electron accepting organic material is a fullerene compound.

7. The material of claim 5, wherein the electron accepting organic material is a fullerene compound.

8. The electron donating organic material of claim 1, wherein the heteroarylene group is a heteroaromatic ring group having an atom or atoms other than carbon selected from the group consisting of a thienyl group, a furyl group, a pyrrolyl group, an imidazolyl group, a pyrazolyl group, an oxazolyl group, a pyridyl group, a pyrazyl group, a pyrimidyl group, a quinolinyl group, an isoquinolyl group, a quinoxalyl group, an acridinyl group and a carbazolyl group.

9. An electron donating organic material for photovoltaic devices which comprises a conjugated polymer represented by formula (1):

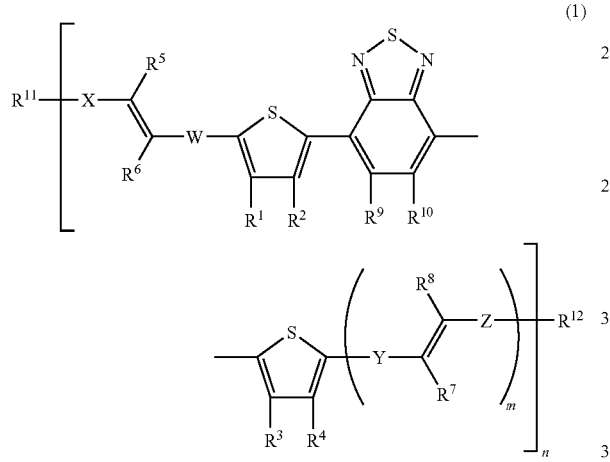

(1)

wherein $R^1$ to $R^{10}$ may be the same or different from each other and are each selected from the group consisting of hydrogen, an alkyl group, an alkoxy group and an aryl group; $R^{11}$ and $R^{12}$ may be the same or different from each other and are each selected from the group consisting of hydrogen, an alkyl group, an aryl group, a heteroaryl group and halogen; and W and Y may be the same or different from each other and are each selected from the group consisting of a single bond, an arylene group, a heteroarylene group which is a heteroaromatic ring group having an atom or atoms other than carbon selected from the group consisting of a thienyl group, a furyl group, a pyrrolyl group, an imidazolyl group, a pyrazolyl group, an oxazolyl group, a pyridyl group, a pyrazyl group, a pyrimidyl group, a quinolinyl group, an isoquinolyl group, a quinoxalyl group, an acridinyl group and a carbazolyl group, and an ethenylene group and at least one of them is a heteroarylene group when n=1, wherein each may be selected from the group consisting of a single bond, an arylene group, a heteroarylene group, an ethenylene group, and an ethenylene group when n>1; m is 0 or 1; n is within a range of 1 to 1000.

10. An electron donating organic material for photovoltaic devices which comprises a conjugated polymer represented by formula (1):

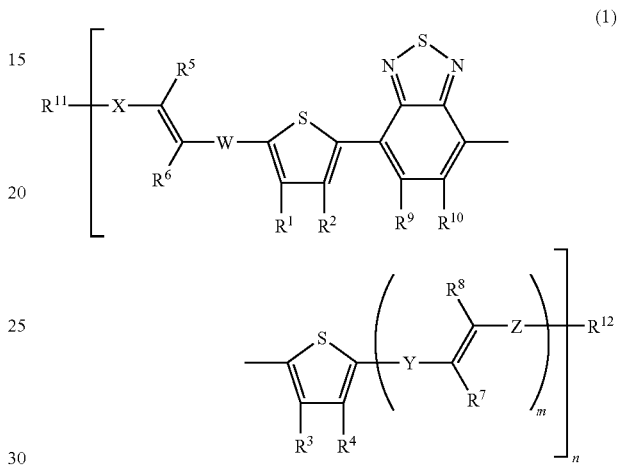

(1)

wherein $R^1$ to $R^{10}$ may be the same or different from each other and are each selected from the group consisting of hydrogen, an alkyl group, an alkoxy group and an aryl group; $R^{11}$ and $R^{12}$ may be the same or different from each other and are each selected from the group consisting of hydrogen, an alkyl group, an aryl group, a heteroaryl group and halogen; and W and Y may be the same or different from each other and are each selected from the group consisting of a single bond, an arylene group, a heteroarylene group, an ethenylene group, and an ethynylene group; X and Z may be the same or different from each other, wherein each may be selected from the group consisting of an arylene group, a heteroarylene group, and an ethenylene group and at least one of them is a thienyl group when n=1, wherein each may be selected from the group consisting of a single bond, an arylene group, a heteroarylene group, an ethenylene group, and an ethynylene group when n>1; m is 0 or 1; n is within a range of 1 to 1000.

* * * * *